(12) United States Patent
Noda et al.

(10) Patent No.: US 9,153,430 B2
(45) Date of Patent: Oct. 6, 2015

(54) SUBSTRATE PROCESSING APPARATUS, METHOD OF MANUFACTURING SEMICONDUCTOR DEVICE AND PROGRAM

(71) Applicant: Hitachi Kokusai Electric Inc., Tokyo (JP)

(72) Inventors: Takaaki Noda, Toyama (JP); Jie Wang, Toyama (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 257 days.

(21) Appl. No.: 13/725,953

(22) Filed: Dec. 21, 2012

(65) Prior Publication Data

US 2013/0217242 A1    Aug. 22, 2013

(30) Foreign Application Priority Data

Dec. 26, 2011 (JP) ................................. 2011-284324
Dec. 5, 2012 (JP) ................................. 2012-266118

(51) Int. Cl.
| | |
|---|---|
| *H01L 21/31* | (2006.01) |
| *H01L 21/02* | (2006.01) |
| *H01L 21/673* | (2006.01) |
| *C23C 16/40* | (2006.01) |
| *C23C 16/455* | (2006.01) |

(52) U.S. Cl.
CPC ........ *H01L 21/02263* (2013.01); *C23C 16/402* (2013.01); *C23C 16/45514* (2013.01); *C23C 16/45578* (2013.01); *H01L 21/673* (2013.01)

(58) Field of Classification Search
CPC ................ H01L 21/0226; H01L 21/02271; H01L 21/0228; C23C 16/44; C23C 16/52
USPC .................. 438/778, 761, 764, 782
See application file for complete search history.

(56) References Cited

U.S. PATENT DOCUMENTS

| | | | |
|---|---|---|---|
| 8,236,692 B2 * | 8/2012 | Kato ............................. | 438/680 |
| 8,673,790 B2 * | 3/2014 | Akae et al. .................... | 438/758 |
| 2010/0210118 A1 * | 8/2010 | Mizuno ......................... | 438/770 |

FOREIGN PATENT DOCUMENTS

JP    2010-219500    9/2010

* cited by examiner

*Primary Examiner* — Kevin M Picardat
(74) *Attorney, Agent, or Firm* — Edell, Shapiro & Finnan LLC

(57) ABSTRACT

Provided is a substrate processing apparatus. The substrate processing apparatus includes: a process chamber configured to accommodate a substrate; a substrate holding member configured to hold the substrate in the process chamber; a first gas supply system including a first gas supply hole for supplying a first process gas into the process chamber; a second gas supply system including a second gas supply hole for supplying a second process gas into the process chamber; and a catalyst supply system including a catalyst supply hole for supplying a catalyst into the process chamber, wherein an angle between a first imaginary line connecting a center of the substrate holding member and the first gas supply hole and a second imaginary line connecting the center of the substrate holding member and the catalyst supply hole ranges from 63.5 degrees to 296.5 degrees.

9 Claims, 28 Drawing Sheets

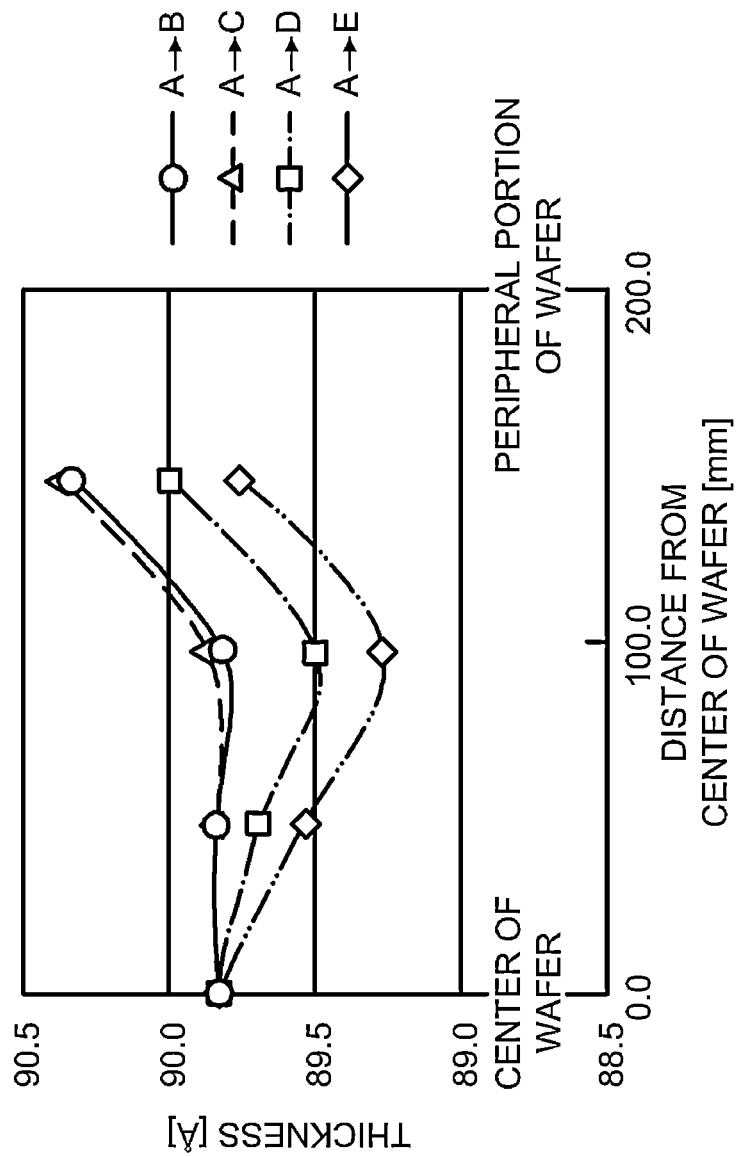

SUBSTRATE PROCESSING APPARATUS, METHOD OF MANUFACTURING SEMICONDUCTOR DEVICE AND PROGRAM

CROSS REFERENCE TO RELATED APPLICATIONS

This application claims foreign priority under 35 U.S.C. §119(a)-(d) to Application Nos. JP 2011-284324 filed on Dec. 26, 2011 and JP2012-266118 filed on Dec. 5, 2012, the entire contents of each of which are hereby incorporated by reference.

FIELD OF THE INVENTION

The present invention relates to a substrate processing apparatus, a method of manufacturing a semiconductor device and program.

BACKGROUND

As a method for forming a thin film, such as a silicon oxide film ($SiO_2$) or a silicon nitride film ($Si_3N_4$), on a substrate at a low temperature, a method of alternately supplying a process gas (silicon-containing gas or the like) or a reactive gas (oxygen- or nitrogen-containing gas or the like) into a process chamber may be used. In this instance, a method for forming a film at a low temperature of 200° C. or less by supplying a catalyst into the process chamber may be used.

In Japanese Unexamined Patent Application Publication No. 2010-219500, a $SiO_2$ film forming sequence is disclosed as a typical example of a thin film. In the film forming sequence, a silicon-containing gas and a catalyst are supplied to a substrate accommodated in a process chamber, the silicon-containing gas remaining in the process chamber is removed, an oxygen-containing gas and a catalyst are supplied to the substrate, and then the oxygen-containing gas remaining in the process chamber is removed, thereby forming a $SiO_2$ film on the substrate. Using the film forming sequence as one cycle, the $SiO_2$ film having a desired film thickness may be obtained by repeating the film forming sequence a predetermined number of times.

SUMMARY

However, when forming the $SiO_2$ film on the substrate as described above, there is a problem that the $SiO_2$ film has film thickness distribution such that the film is thicker in an outer peripheral portion of the substrate than in the center of the substrate. When forming a thin film on a patterned substrate under film forming conditions having such a film thickness distribution, a slope of the film thickness from the outer peripheral portion of the substrate to the center thereof is further steepened by a loading effect, and therefore in-plane distribution of film thickness on the patterned substrate is significantly deteriorated.

Accordingly, the present invention is directed to provide a substrate processing apparatus, a method of manufacturing a semiconductor device and program, in which in-plane distribution of film thickness of a thin film formed on a substrate is made uniform.

According to an aspect of the present invention, there is provided a substrate processing apparatus including: a process chamber configured to accommodate a substrate; a substrate holding member configured to hold the substrate in the process chamber; a first gas supply system including a first gas supply hole for supplying a first process gas into the process chamber; a second gas supply system including a second gas supply hole for supplying a second process gas into the process chamber; and a catalyst supply system including a catalyst supply hole for supplying a catalyst into the process chamber, wherein an angle between a first imaginary line connecting a center of the substrate holding member and the first gas supply hole and a second imaginary line connecting the center of the substrate holding member and the catalyst supply hole ranges from 63.5 degrees to 296.5 degrees.

According to another aspect of the present invention, there is provided a method of manufacturing a semiconductor device, including: a first process of supplying a first process gas and a catalyst into a process chamber accommodating therein a substrate held by a substrate holding member through a first gas supply hole provided in a first process gas supply system and a catalyst through a catalyst supply hole provided in a catalyst supply system, respectively, the first gas supply hole and the catalyst supply hole being arranged in a manner that an angle between a first imaginary line connecting a center of the substrate holding member and the first gas supply hole and a second imaginary line connecting the first imaginary line and a center of the substrate holding member ranges from 63.5 degrees to 296.5 degrees; and a second process of supplying a second process gas and the catalyst into the process chamber through a second gas supply hole provided in a second process gas supply system and the catalyst supply hole, respectively.

According to still another aspect of the present invention, there is provided a program that causes a computer to perform sequences of: supplying a first process gas and a catalyst into a process chamber accommodating therein a substrate held by a substrate holding member through a first gas supply hole provided in a first process gas supply system and a catalyst supply hole provided in a catalyst supply system, respectively, the first gas supply hole and the catalyst supply hole being arranged in a manner that an angle between a first imaginary line connecting a center of the substrate holding member and the first gas supply hole and a second imaginary line connecting the first imaginary line and the center of the substrate holding member ranges from 63.5 degrees to 296.5 degrees; and supplying a second process gas and the catalyst into the process chamber through a second gas supply hole provided in a second process gas supply system and the catalyst supply hole, respectively.

BRIEF DESCRIPTION OF THE DRAWINGS

FIGS. 13A through 13C are graphs showing correlation between a distance and a thickness in in-plane distribution of film thickness of a $SiO_2$ film according to Comparative Example 1;

DETAILED DESCRIPTION

Knowledge Obtained by Inventors

Figure 14:
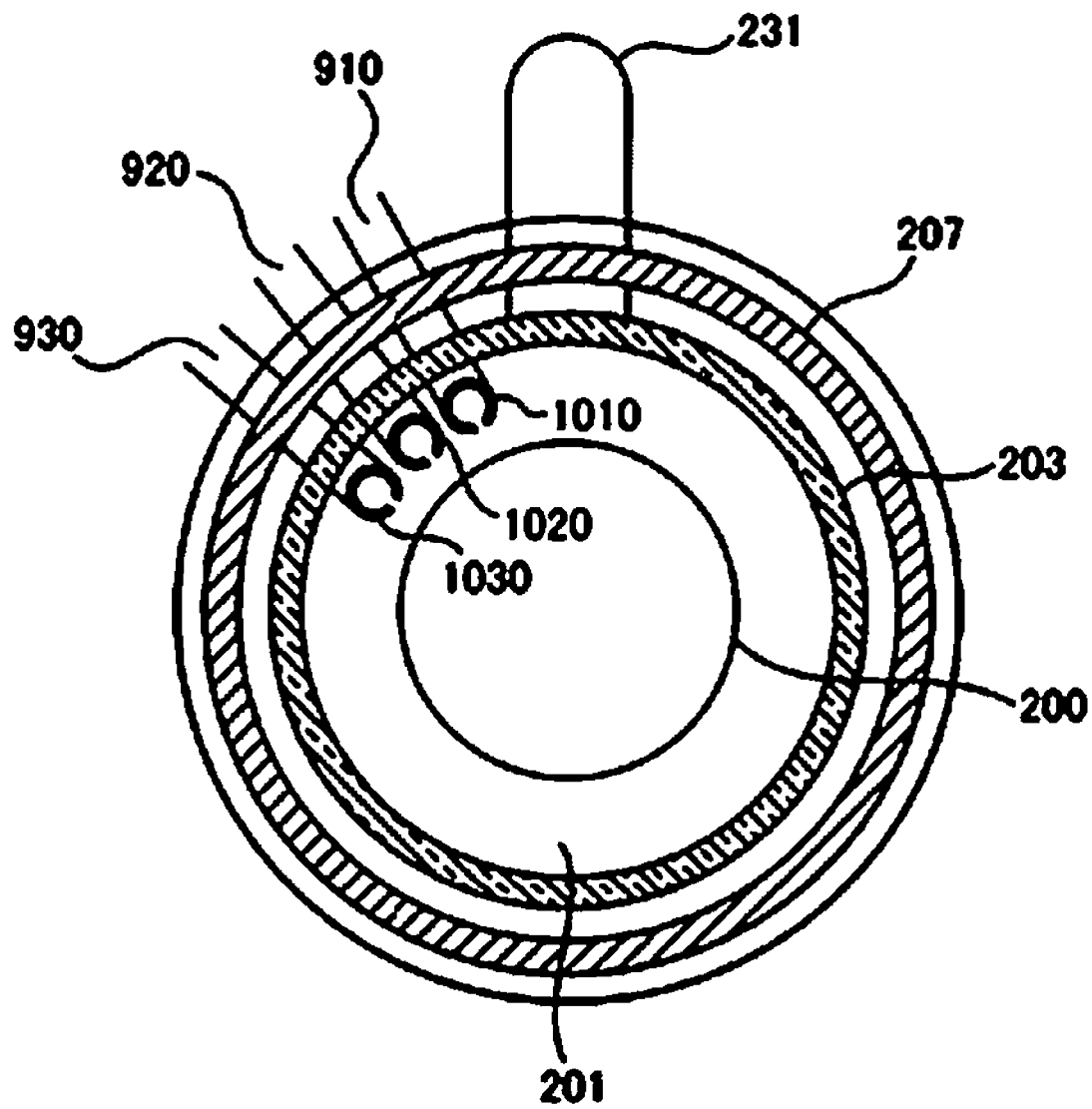
FIG. 14 is a top view showing an arrangement relationship of each nozzle as a gas supply means of the related art in a processing furnace.

Based on experimental results of the inventors, it can be found that non-uniformity of the in-plane distribution of film thickness as described above is caused by an arrangement relationship of each nozzle included in a gas supply system. FIG. 14 is a top view showing an arrangement relationship of each nozzle included in a gas supply system generally used when performing a film forming sequence for forming a film on a substrate, in a processing furnace of a substrate processing apparatus.

Referring to FIG. 14, a wafer 200 is placed as a substrate in a process chamber 201 formed in a reaction tube 203 including a heater 207 formed on an outer circumferential surface thereof, and nozzles 910, 920, and 930 for supplying a process gas to a space formed between an inner wall of the reaction tube 203 and the wafer 200 are provided adjacent to each other. A plurality of gas supply holes 1010, 1020, and 1030 for supplying a process gas to the process chamber 201 are provided in each of the nozzles 910, 920, and 930, and an exhaust pipe 231 for exhausting an atmosphere in the process chamber 201 is connected to the reaction tube 203. Here, when a $SiO_2$ film is adopted as a film formed on the wafer 200, a silicon-containing gas is supplied from the nozzle 910, an oxygen-containing gas is supplied from the nozzle 920, and a catalyst is supplied from the nozzle 930.

Figure 15:
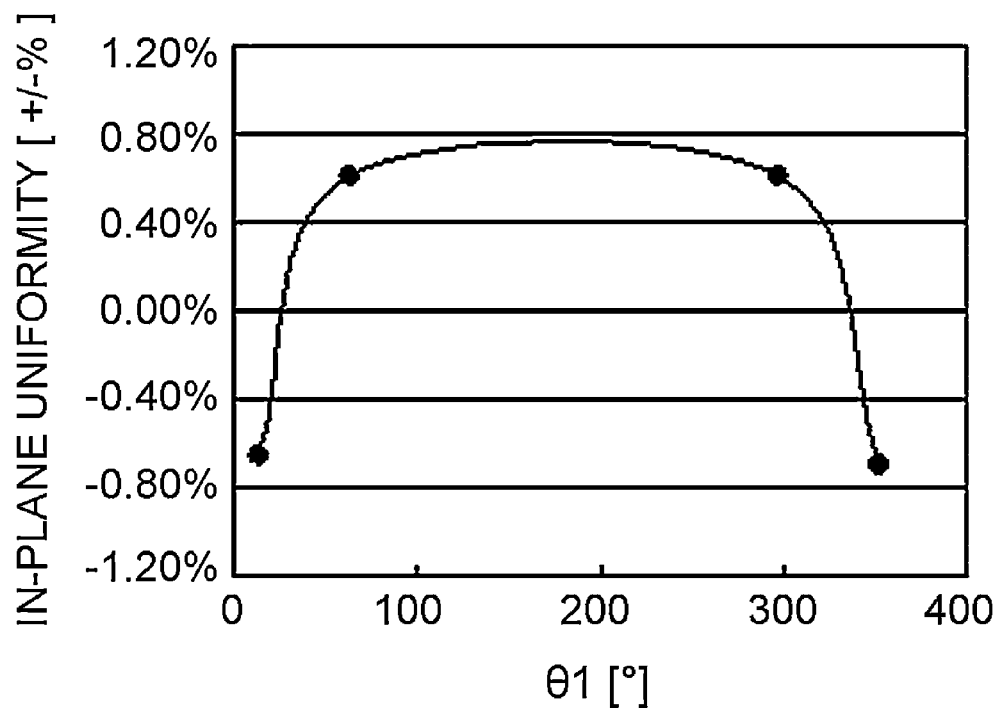
FIG. 15 is a view showing arrangement relationship dependence of each nozzle of in-plane uniformity.

The inventors found the followings points by investigating arrangement relationship dependence of each nozzle of in-plane uniformity as shown in FIG. 15. An outer peripheral portion of the substrate is caused to easily have thicker film thickness (concave shape) distribution than a center portion of the substrate when the silicon-containing gas and the catalyst and the oxygen-containing gas and the catalyst are supplied from almost the same position by the above-described nozzle arrangement and thereby a $SiO_2$ film is easily formed in the vicinity of the nozzles. FIG. 15 is a view showing a state in which a $SiO_2$ film is formed on a bare substrate (substrate without a pattern) using a silicon-containing gas, an oxygen-containing gas, and a catalyst, and shows in-plane uniformity of each case in which an angle in a clockwise direction between a first imaginary line L1 connecting a center point O when the process chamber 210 is viewed from above and the gas supply hole 1010 and a second imaginary line L2 connecting the center point O when the process chamber 210 is viewed from above and the gas supply hole 1030 is changed to 13.5°, 63.5°, 296.5°, and 351.5°.

From FIG. 15, it can be found that the in-plane uniformities of the angles θ1 of 13.5°, 63.5°, 296.5°, and 351.5° are −0.65%, 0.61%, 0.61%, and −0.69%, respectively. In this manner, in the case of a positional relation in which the angle θ1 is below 13.5° or above 296.5°, when the silicon-containing gas and the catalyst are supplied, the outer peripheral portion of the substrate has a thicker film thickness (concave shape) than the center portion of the substrate. That is, in the case of the positional relation in which the angle θ1 is below 13.5° or above 296.5°, when the silicon-containing gas and the catalyst are supplied, the silicon-containing gas and the catalyst are supplied from almost the same position, and therefore a silicon layer may be easily formed in the vicinity of the nozzles. Accordingly, in the case in which each nozzle has the above-described positional relation, when the $SiO_2$ film is formed, the outer peripheral portion of the substrate has a thicker film thickness (concave shape) than the center portion of the substrate.

However, in the case of a positional relation in which the angle θ1 is equal to or greater than 63.5° and equal to or less than 296.5°, when the silicon-containing gas and the catalyst are supplied, the outer peripheral portion of the substrate has a thinner film thickness (convex shape) than the center portion of the substrate. That is, in the case of the positional relation in which the angle θ1 is equal to or greater than 63.5° and equal to or less than 296.5°, when the silicon-containing gas and the catalyst are supplied, the silicon-containing gas and the catalyst are supplied from positions spaced apart from each other, and therefore the Si layer is difficult to form in the vicinity of the nozzle. Accordingly, in the case in which each nozzle has the above-described positional relation, when the $SiO_2$ film is formed, the outer peripheral portion of the substrate has a thinner film thickness (concave shape) than the center portion of the substrate. In general, a loading effect caused by an increase in a pattern surface area is exerted when a film is formed on a substrate with a pattern, and therefore it is preferable that film thickness distribution on a bare substrate have a convex shape. In the case in which the film thickness distribution on the bare substrate has the convex shape, when forming a film on the patterned substrate in the same manner, uniform film thickness distribution may be obtained by the loading effect.

Hereinafter, a configuration of a processing furnace of a substrate processing apparatus according to an exemplary embodiment of the present invention will be described with reference to the accompany drawings. The substrate processing apparatus according to an exemplary embodiment of the present invention may be configured as a semiconductor manufacturing apparatus that performs a process in a manufacturing method of a semiconductor device (IC) as an example. In addition, in the following descriptions, a case in which a vertical substrate processing apparatus for performing an oxidation process, a diffusion process, a CVD process, and the like with respect to a substrate is applied as the substrate processing apparatus will be described. In addition, the present invention is not limited to the substrate processing apparatus, and may be applied to a substrate processing apparatus including a single-wafer processing furnace, a hot wall processing furnace, or a cold wall processing furnace. In addition, like numbers refer to like elements throughout the description of the figures. In addition, terminologies such as "upper" and "lower" used in the following descriptions are used for the purpose of convenience, and do not limit the directions.

Configuration of Processing Furnace

Figure 1:
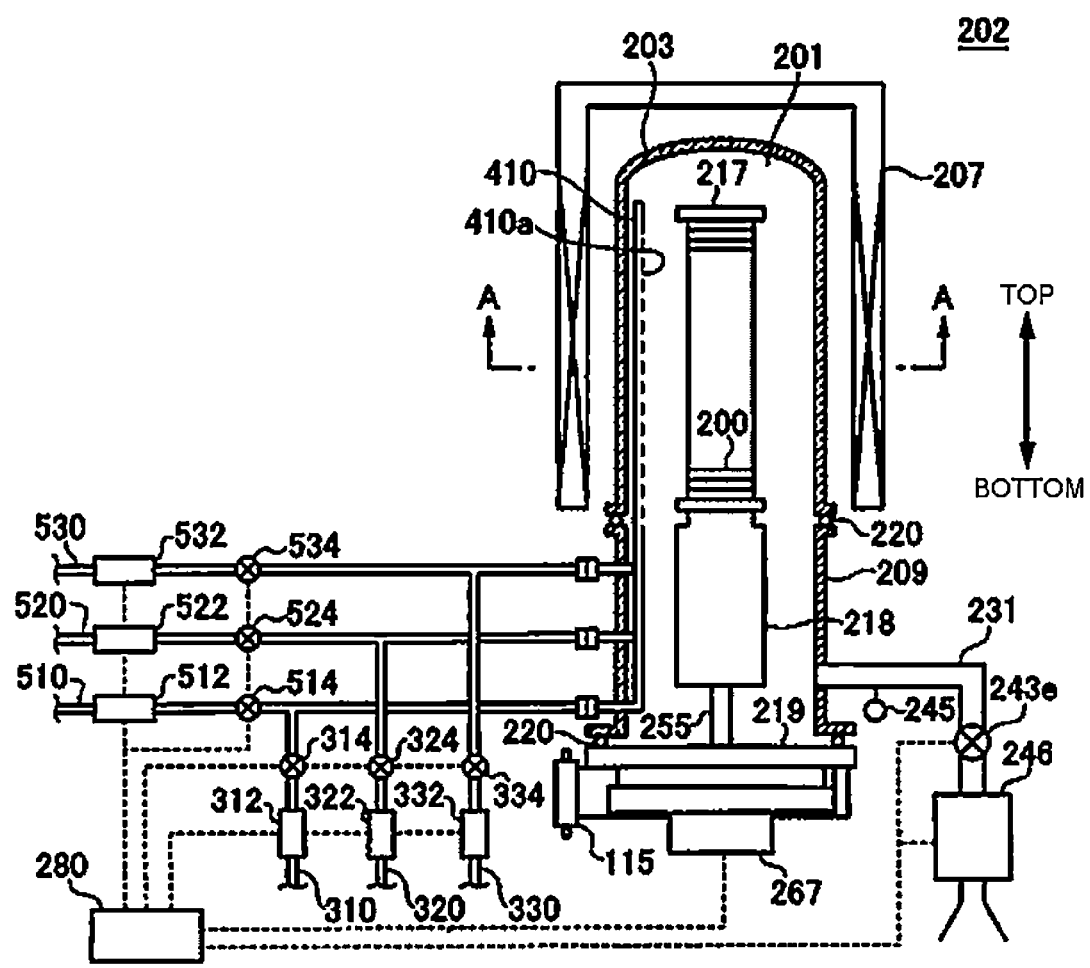
FIG. 1 is a schematic configuration diagram showing a processing furnace according to an exemplary embodiment of the present invention and a member attached to the processing furnace, particularly, vertically showing the processing furnace.
Figure 2:
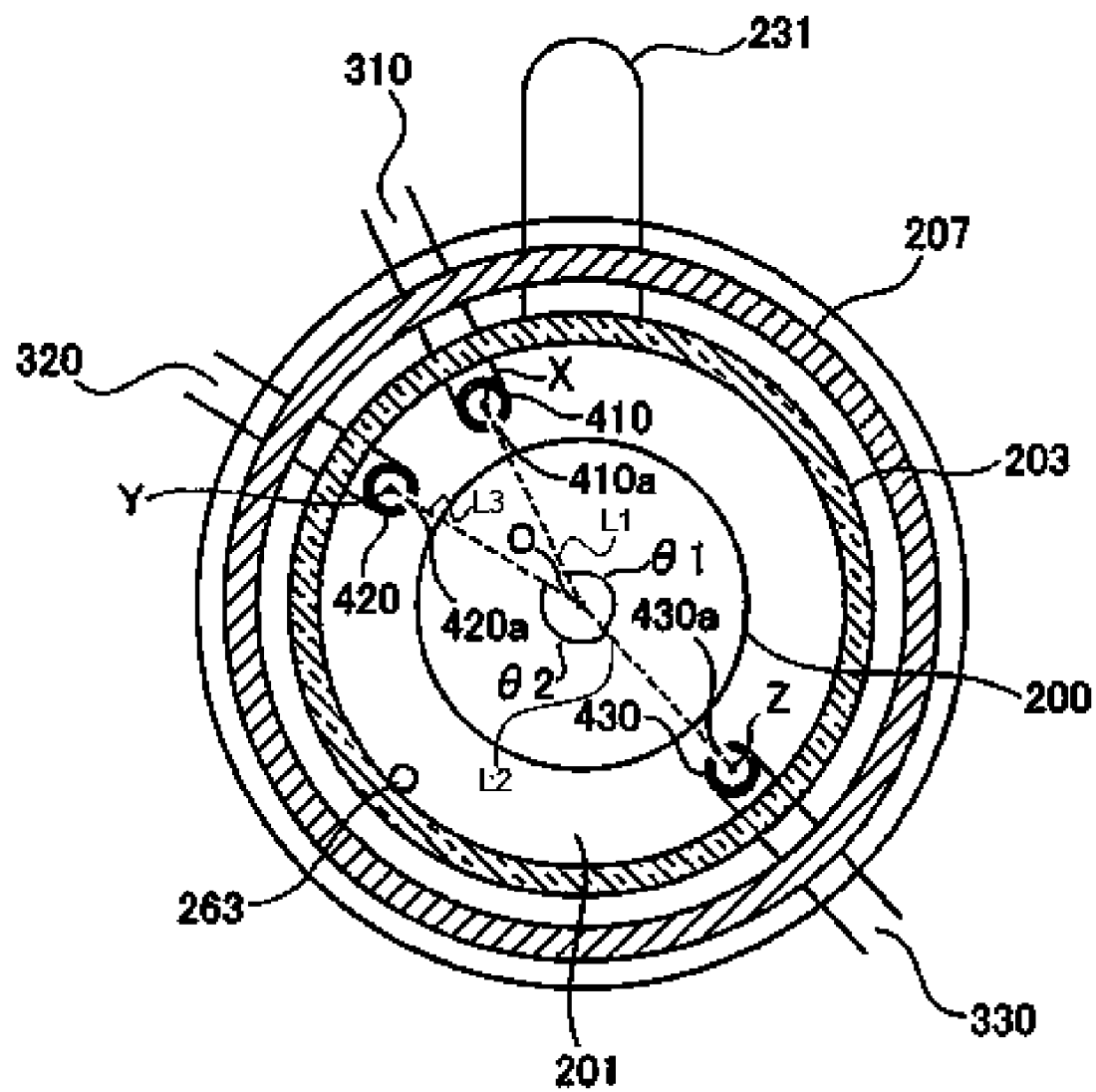
FIG. 2 is a cross-sectional view of the processing furnace taken along line A-A of FIG. 1.
Figure 3:
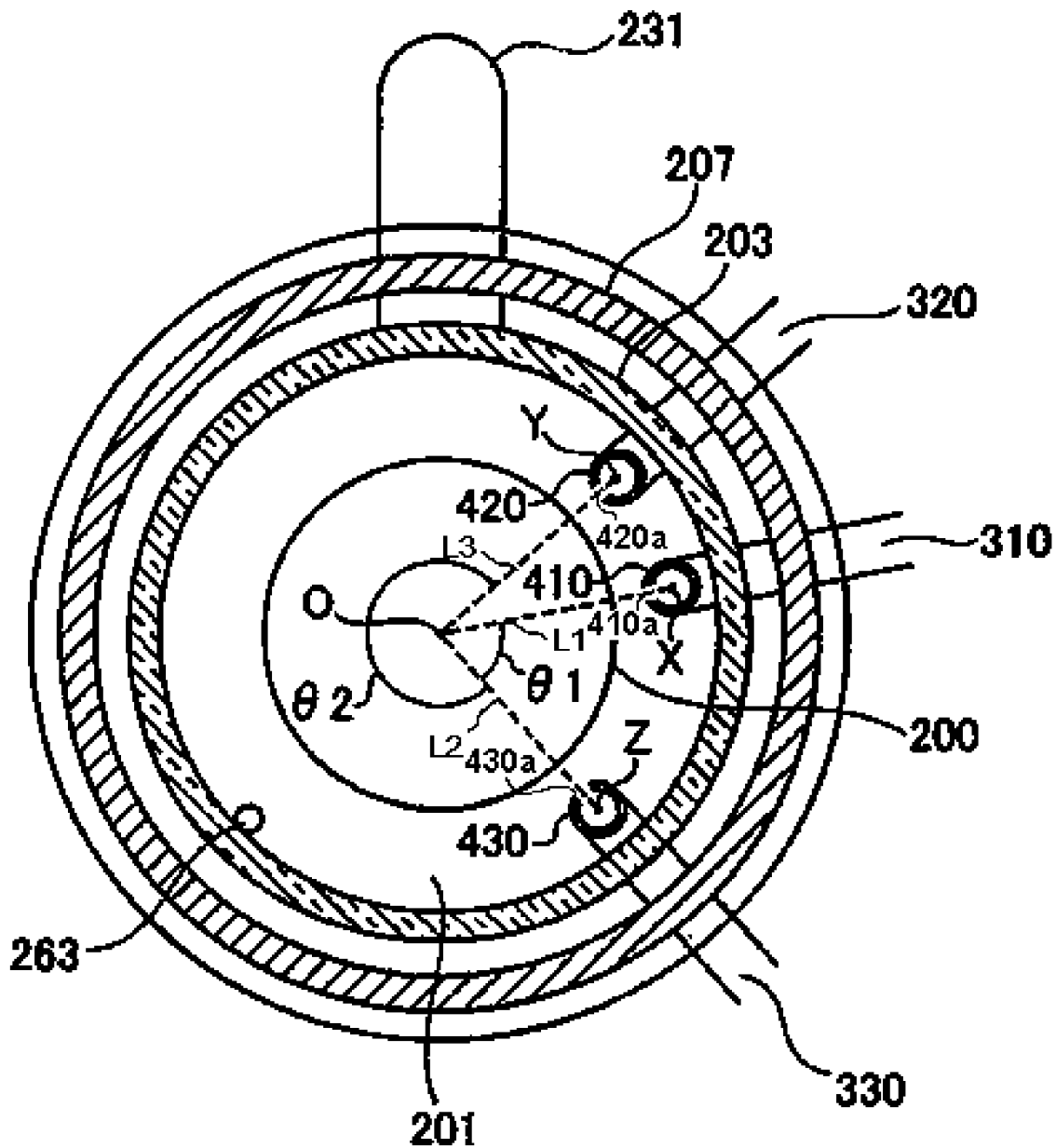
FIG. 3 is a variant of the cross-sectional view of the processing furnace taken along line A-A of FIG. 1.

FIG. 1 is a schematic configuration diagram showing an example of a processing furnace according to an exemplary embodiment of the present invention and a member attached to the processing furnace, and particularly, vertically showing the processing furnace, FIG. 2 is a cross-sectional view of the processing furnace taken along line A-A of FIG. 1, and FIG. 3 is a variant of the cross-sectional view of the processing furnace taken along line A-A of FIG. 1.

Reaction Tube

As shown in FIGS. 1 through 3, the processing furnace 202 includes a reaction tube 203 that is fixedly supported by a tubular body (not shown) arranged in a vertical direction so that a center line is perpendicular to the processing furnace 202. The reaction tube 203 is formed in a cylindrical shape by a highly heat-resistant material such as quartz ($SiO_2$) or silicon carbide (SiC).

Reaction Tube

A manifold 209 made of stainless is provided on a lower portion of the reaction tube 203 via an O-ring 220 that is a seal member. A lower opening of the manifold 209 is securely closed by a seal cap 219 as a lid body via the O-ring 220. The seal cap 219 is made of a metal such as stainless or the like, and formed in a disc shape. In the processing furnace 202, a process chamber 201 is formed by at least the reaction tube 203, the manifold 209, and the seal cap 219.

Substrate Holding Member

A boat support 218 for supporting a boat 217 is provided in the seal cap 219. The boat support 218 is made of a heat-resistant material such as quartz or silicon carbide, acts as a support for supporting the boat, and includes an insulation unit. As shown in FIG. 1, the boat 217 includes a bottom plate (not shown) fixed to the boat support 218 and a top plate (not shown) arranged above the bottom plate, and has a configuration in which a plurality of columnar supports are provided between the bottom plate (not shown) and the top plate (not shown). The wafers 200 that are a plurality of substrates (for example, about 50 to 150) are held by the boat 217. The wafers 200 are made of silicon or the like. In a state in which a horizontal posture is held in such a manner that the plurality of wafers 200 are aligned in a vertical direction with respect to a center of the wafers 200 while having a predetermined interval therebetween, the plurality of wafers 200 are supported by a columnar support (not shown) of the boat 217.

In the above-described processing furnace 202, the boat 217 is supported by the boat support 218 in a state in which the plurality of wafers 200 that have been subjected to a batch process are laminated on the boat 217 in a multi-layered manner, and therefore the boat may be elevated and lowered (loaded or unloaded) in the process chamber 201 by a boat elevator 115. A boat rotation mechanism 267 for rotating the boat 217 is provided in a lower end portion of the boat support 218 for supporting the boat 217 in order to improve uniformity of the process. A rotation shaft 255 of the boat rotation mechanism 267 is connected to the boat 217 while passing through the seal cap, and the wafer 200 as well as the boat 217 supported by the boat support 218 may be rotated by driving the boat rotation mechanism 267.

A driving control unit (not shown) is electrically connected to the boat rotation mechanism 267 and the boat elevator 115. The driving control unit (not shown) may control the boat rotation mechanism 267 and the boat elevator 115 to perform a desired operation at a desired timing.

Heating Unit

A heater 207 for heating the wafers 200 is provided in the processing furnace 202 so as to surround the reaction tube 203. The heater 207 includes a cylindrical insulation member whose both ends are closed, and a plurality of heater strands, and has a configuration in which the heater strands are provided in the heating member. A temperature sensor 263 is provided as a temperature detector in the reaction tube 203, so that a temperature in the process chamber 201 has desired temperature distribution by adjusting a conduction state to the heater 207 on the basis of temperature information detected by the temperature sensor 263. The temperature sensor 263 is formed in an L shape, like nozzles 410, 420, and 430, and provided along an inner wall of the reaction tube 203. A heating unit (heating system) mainly includes the heater 207 and the temperature sensor 263.

Exhaust Unit

An exhaust pipe 231 for exhausting an atmosphere in the process chamber 201 is connected to the process chamber 201. A vacuum pump 246 may be connected to the exhaust pipe 231 as a vacuum exhaust device via a pressure sensor 245 serving as a pressure detector (pressure detection unit) for detecting a pressure in the process chamber 201 and an Auto Pressure Controller (APC) valve 243e serving as a pressure adjustor (pressure adjusting unit), and perform vacuum exhaust so that a pressure in the process chamber 201 becomes a predetermined pressure (vacuum degree). The APC valve 243e is an opening and closing valve that may activate and stop the vacuum exhaust of the process chamber 201 by opening and closing operations, adjust an opening degree of the valve, and adjust the pressure in the process chamber 201. The exhaust unit (exhaust system) may mainly include the exhaust pipe 231, the APC valve 243e, and the pressure sensor 245. The exhaust unit may include the vacuum pump 246.

In addition, the APC valve 243e may perform and stop vacuum exhaust in the process chamber 201 by opening and closing the valve in a state of operating the vacuum pump 246, and adjust the pressure in the process chamber 201 by adjusting a valve opening degree in a state of operating the vacuum pump 246. That is, the exhaust system may make an "actual pressure" close to a predetermined "set pressure" in the process chamber 201 by adjusting the opening degree of the APC valve 243e based on pressure information detected by the pressure sensor 245 while operating the vacuum pump 246. For example, when there is no change in a flow rate of a gas supplied into the process chamber 201, or when gas supply into the process chamber 201 is stopped, in order to change the actual pressure in the process chamber 201, the set pressure in the process chamber 201 is changed, and the opening degree of the APC valve 244 is changed to an opening degree depending on the above-described set pressure. As a result, exhaust capacity of the exhaust line is changed, and therefore the actual pressure in the process chamber 201 is gradually made close to the above-described set pressure. In this manner, the "set pressure" in the process chamber 201 may denote a "target pressure" when performing control of the pressure in the process chamber 201, and the "actual pressure" in the process chamber 201 may follow the target pressure. In addition, "changing the set pressure in the process chamber 201" may denote "changing the opening degree of the APC valve 243e in order to exhaust capacity of the exhaust line," and may be a command for changing the opening degree of the APC valve 243e.

Gas Supply Unit

As shown in FIGS. 1 through 3, the nozzles 410, 420, and 430 are provided in the process chamber 201 so as to pass through a side wall of the manifold 209. Gas supply pipes 310, 320, and 330 are respectively connected to the nozzles 410, 420, and 430. In this manner, three nozzles and three gas supply pipes are provided in the reaction tube 203, and a plurality of types of gases, here, three types of gases, may be supplied into the process chamber 201. In addition, the nozzles 410, 420, and 430 may be provided so as to pass through a lower portion of the reaction tube 203.

A mass flow controller 312 (MFC) that is a flow rate controller (flow rate control unit), and the opening and closing valve 314 are provided in the gas supply pipe 310 in the stated order from the upstream side. The above-described nozzle 410 is connected to a distal end of the gas supply pipe 310. The nozzle 410 is provided in an arc-shaped space between the inner wall of the reaction tube 203 and the wafer 200 so as to be elevated upwardly in a stacked direction of the wafers 200 from a lower portion of the inner wall of the reaction tube 203 to an upper portion thereof. That is, the nozzle 410 is provided in a region that horizontally surrounds a side wafer arrangement region of a wafer arrangement region in which the wafers 200 are arranged, so as to follow the wafer arrangement region. The nozzle 410 is formed as an L-shaped long nozzle, a horizontal portion of the nozzle 410 is provided so as to pass through a lower side wall of the reaction tube 203, and a vertical portion thereof is provided so as to be elevated from one end side of at least the wafer arrangement region towards the other end thereof. A plurality of gas supply holes 410a for supplying a process gas are provided on a side surface of the nozzle 410. The plurality of gas supply holes 410a include the same sized opening area or an inclined opening area across from the bottom of the gas supply hole 410a to the top thereof, and are provided with the same opening pitch.

In addition, an inert gas supply pipe 510 for supplying an inert gas is connected to the gas supply pipe 310. In the inert gas supply pipe 510, a mass flow controller 512 (MFC) that is the flow rate controller (flow rate control unit) and the opening and closing valve 514 are provided in the stated order from the upstream side. A first gas supply system may mainly include the gas supply pipe 310, the mass flow controller 312, the valve 314, and the nozzle 410. In addition, a first inert gas supply system may mainly include the inert gas supply pipe 510, the mass flow controller 512, and the valve 514.

A mass flow controller 322 (MFC) that is the flow rate controller (flow rate control unit) and a valve 324 that is the opening and closing valve are provided in the gas supply pipe 320 in the stated order from the upstream side. The above-described nozzle 420 is connected to a distal end of the gas supply pipe 320. The nozzle 420 is provided in an arc-shaped space between the inner wall of the reaction tube 203 and the wafer 200 so as to be elevated upwardly in a stacked direction of the wafers 200 from a lower portion of the inner wall of the reaction tube 203 to an upper portion thereof. That is, the nozzle 420 is provided in a region that horizontally surrounds the side wafer arrangement region of the wafer arrangement region in which the wafers 200 are arranged, so as to follow the wafer arrangement region. The nozzle 420 is formed as an L-shaped long nozzle, a horizontal portion of the nozzle 420 is provided so as to pass through a lower side wall of the reaction tube 203, and a vertical portion thereof is provided so as to be elevated from one end side of at least the wafer arrangement region toward the other end thereof. A plurality of gas supply holes 420a for supplying a process gas are provided on a side surface of the nozzle 420. The plurality of gas supply holes 420a include the same sized opening area or an inclined opening area across from the bottom of the gas supply hole 420a to the top thereof, and are provided with the same opening pitch.

In addition, an inert gas supply pipe 520 for supplying an inert gas is connected to the gas supply pipe 320. In the inert gas supply pipe 520, a mass flow controller 522 (MFC) that is the flow rate controller (flow rate control unit) and a valve 524 that is the opening and closing valve are provided in the gas supply pipe 320 in the stated order from the upstream side. A second gas supply system may mainly include the gas supply pipe 320, the mass flow controller 322, the valve 324, and the nozzle 420. In addition, a second inert gas supply system may mainly include the inert gas supply pipe 520, the mass flow controller 522, and the valve 524.

A mass flow controller 332 (MFC) that is a flow rate controller (flow rate control unit), and a valve 334 that is an opening and closing valve are provided in the gas supply pipe 330 in the stated order from the upstream side. The above-described nozzle 430 is connected to a distal end of the gas supply pipe 330. The nozzle 430 is provided in an arc-shaped space between the inner wall of the reaction tube 203 and the wafer 200 so as to be elevated upwardly in a stacked direction of the wafers 200 from a lower portion of the inner wall of the reaction tube 203 to an upper portion thereof. That is, the nozzle 430 is provided in a region that horizontally surrounds a side wafer arrangement region of a wafer arrangement region in which the wafers 200 are arranged, so as to follow the wafer arrangement region. The nozzle 430 is formed as an L-shaped long nozzle, a horizontal portion of the nozzle 430 is provided so as to pass through a lower side wall of the reaction tube 203, and a vertical portion thereof is provided so as to be elevated from one end side of at least the wafer arrangement region towards the other end thereof. A plurality of gas supply holes 430a for supplying a process gas are provided on a side surface of the nozzle 430. The plurality of gas supply holes 430a include the same sized opening area or an inclined opening area across from the bottom of the gas supply hole 430a to the top thereof, and are provided with the same opening pitch.

In addition, an inert gas supply pipe 530 for supplying an inert gas is connected to the gas supply pipe 330. In the inert gas supply pipe 530, a mass flow controller 532 (MFC) that is the flow rate controller (flow rate control unit) and the opening and closing valve 534 are provided in the stated order from the upstream side. A third gas supply system may mainly include the gas supply pipe 330, the mass flow controller 332, the valve 334, and the nozzle 430. In addition, a third inert gas supply system may mainly include the inert gas supply pipe 530, the mass flow controller 532, and the valve 534.

In this manner, according to a gas supply method of the present embodiment, a gas is loaded via the nozzles 410, 420, and 430 which are arranged in an arc-shaped vertically long space defined by the inner wall of the reaction tube 203 and ends of the plurality of laminated wafers 200, and a gas is emitted into the reaction tube 203 in the vicinity of the wafers 200 through the gas supply holes 410a, 420a, and 430a which are respectively opened in the nozzles 410, 420, and 430, and therefore a main flow of the gas in the reaction tube 203 is in a direction parallel to a surface of the wafer 200, that is, horizontal with the surface thereof. By this configuration, a gas may be evenly supplied to each of the wafers 200, and a film thickness of a thin film formed on each of the wafers 200 may be made uniform. In addition, a remaining gas after the reaction flows in a direction of the exhaust pipe 231, but the flow of the remaining gas is appropriately specified by a position of the exhaust post, and is not limited to a vertical direction.

Here, in the processing furnace 202 according to the present embodiment, as shown in FIGS. 2 and 3, the gas supply holes 410a, 420a, and 430a of the nozzles 410, 420, and 430 is oriented to a center point O (regarded as a center point of the wafers 200) of the circular boat 217 when viewed from above. In addition, the center point O of the boat 217 may be regarded as a center point of the process chamber 201. In addition, the nozzle 430 of the gas supply pipe 330 is arranged around the boat 217 so that an angle θ1 in a clockwise direction between a first imaginary line L1 connecting a center point O when the process chamber 201 is viewed from above and the gas supply hole 410a and a second imaginary line L2 connecting the center point O when the process chamber 201 is viewed from above and the gas supply hole 430a is in a range equal to or greater than 63.5° and equal to or less than 296.5°. In addition, when a distance from the center point O to a center point X of the gas supply hole 410a and a distance from the center point O to a center point Z of the gas supply hole 430a are each r[m], and a distance between the nozzle 430 and the nozzle 410 is indicated as a length of an arc XZ from the center point X to the center point Z, r×127÷360π≤arc (XZ)[m]≤r×593÷360π may be obtained.

By this configuration, when a variety of types of gases flow through each nozzle in the processing furnace 202 of the substrate processing apparatus so as to form a thin film, a mixing ratio of a first process gas and a catalyst is increased in a center portion of the wafer 200 rather than an outer peripheral portion thereof, and therefore a film of the center portion may easily have a concave film thickness. Meanwhile, since the thin film is formed on the patterned wafer 200, the film of the center portion may easily have a convex film thickness by a loading effect. Accordingly, the center portion easily has the convex film thickness by increasing the mixing ratio of the first process gas and the catalyst in the center portion, so that an effect in which the film of the center portion easily has the concave film thickness by the loading effect is offset, thereby making in-plane distribution of film thickness of the thin film formed on the patterned wafer 200 uniform.

In order to make in-plane distribution of a thickness of the thin film formed on the pattern wafer 200 more uniform by increasing the mixing ratio of a second process gas and a catalyst in the center portion of the wafer 200 rather than the outer peripheral portion thereof, it is preferable that the nozzle 430 of the gas supply pipe 330 be arranged in the vicinity of the substrate holding member so that an angle in a counterclockwise direction between a third imaginary line L3 connecting the center of the boat 217 when viewed from above and the gas supply hole 420a and the second imaginary line L2 is in a range equal to or greater than 63.5° and equal to or less than 296.5°. In addition, when a distance from the center point O to the center point Y and a distance from the center point O to the center point Z are each r[m], and a distance between the nozzle 430 and the nozzle 420 is indicated as a length of an arc YZ from the center point Y to the center point Z, r×127÷360π≤arc (YZ)[m]≤r×593÷360π may be obtained.

In FIG. 2, a case in which the angle θ1 and the angle θ2 are the same angle and close to 180° (approximately 176°) is shown. In FIG. 3, a case in which the angle (θ1) is approximately 63.5° and the angle (θ2) is approximately 269.5° is shown.

In addition, in order to increase the mixing ratio of the first and second process gases and the catalyst in the center portion of the wafer 200 rather than the outer peripheral portion thereof, it is preferable that a distance (length of an arc XZ) between the nozzle 410 of the gas supply pipe 310 and the nozzle 430 of the gas supply pipe 330 and a distance (length of an arc YZ) between the nozzle 420 of the gas supply pipe 320 and the nozzle 430 of the gas supply pipe 330 be greater than a distance (length of an arc XY) between the nozzle 410 of the gas supply pipe 310 and the nozzle 420 of the gas supply pipe 320.

In order to further increase the mixing ratio of the first and second process gases and the catalyst in the center portion of the wafer 200, as shown in FIG. 2, it is preferable that the distance between the nozzle 410 of the gas supply pipe 310 and the nozzle 430 of the gas supply pipe 330 and the distance between the nozzle 420 of the gas supply pipe 320 and the nozzle 430 of the gas supply pipe 330 be substantially the same. In addition, in order to further increase the mixing ratio of the first and second process gases and the catalyst in the center portion of the wafer 200, as shown in FIG. 2, it is preferable that the nozzle 410 of the gas supply pipe 310 and the nozzle 420 of the gas supply pipe 320 be positioned close to each other, and the nozzle 430 of the gas supply pipe 330 be arranged in a position substantially opposite to the nozzle 410 of the gas supply pipe 310 and the nozzle 420 of the gas supply pipe 320 via the boat 217 (wafer 200 held by the boat 217). In addition, "substantially opposite to" does not indicate only a case in which the nozzle 430 of the gas supply pipe 330 is completely opposite to (the angles θ1 and θ2 are 180°) the nozzle 410 of the gas supply pipe 310 and the nozzle 420 of the gas supply pipe 420, and indicates that the angles θ1 and θ2 are in a range of about ±30° to 180°. Meanwhile, in order to mix the first and second process gases and the catalyst in a stepwise manner across from the outer peripheral portion of the wafer 200 to the center portion thereof, as shown in FIG. 3, it is preferable that the nozzle 410 of the gas supply pipe 310 and the nozzle 420 of the gas supply pipe 320 be arranged close to each other, the gas supply pipe 330 be arranged in the vicinity of the boat 217 so that the angle θ1 in the clockwise direction between the first imaginary line L1 and the second imaginary line L2 is substantially 63.5° or 296.5°, and the gas supply pipe 330 be arranged in the vicinity of the boat 217 so that the angle θ2 in the counterclockwise direction between the third imaginary line L3 and the second imaginary line L2 be substantially 296.5° or 63.5°.

As an example of the above-described configuration, a $Si_2Cl_6$ (hexachloro-disilane) gas is introduced into the gas supply pipe 310 as a silicon-containing gas that is a raw gas containing a silicon (Si) element as an example of the first process gas. $H_2O$ is introduced into the gas supply pipe 320 as an oxygen (O)-containing gas that is a reactive gas containing an oxygen (O) element as an example of the second process gas. Nitrogen ($N_2$) is introduced into the inert gas supply pipe as an example of an inert gas. Pyridine ($C_5H_5N$) is introduced into the gas supply pipe 330 as an example of a catalyst. In addition, when using a raw material in a liquid state under normal temperature and normal pressure such as $Si_2Cl_6$, or the like, the raw material is vaporized by a vaporization system such as a vaporizer or a bubbler, and the vaporized material is supplied as a gas.

In addition, when the above-described gas flows through each gas supply pipe, a raw material gas supply system, that is, a silicon-containing gas supply system, may include the first gas supply system. In addition, a reactive gas supply system, that is, an oxygen-containing gas supply system, may include the second gas supply system. In addition, a catalyst supply system may include the third gas supply system. In addition, the third gas supply hole may be referred to as a catalyst supply hole.

Controller

Figure 4:
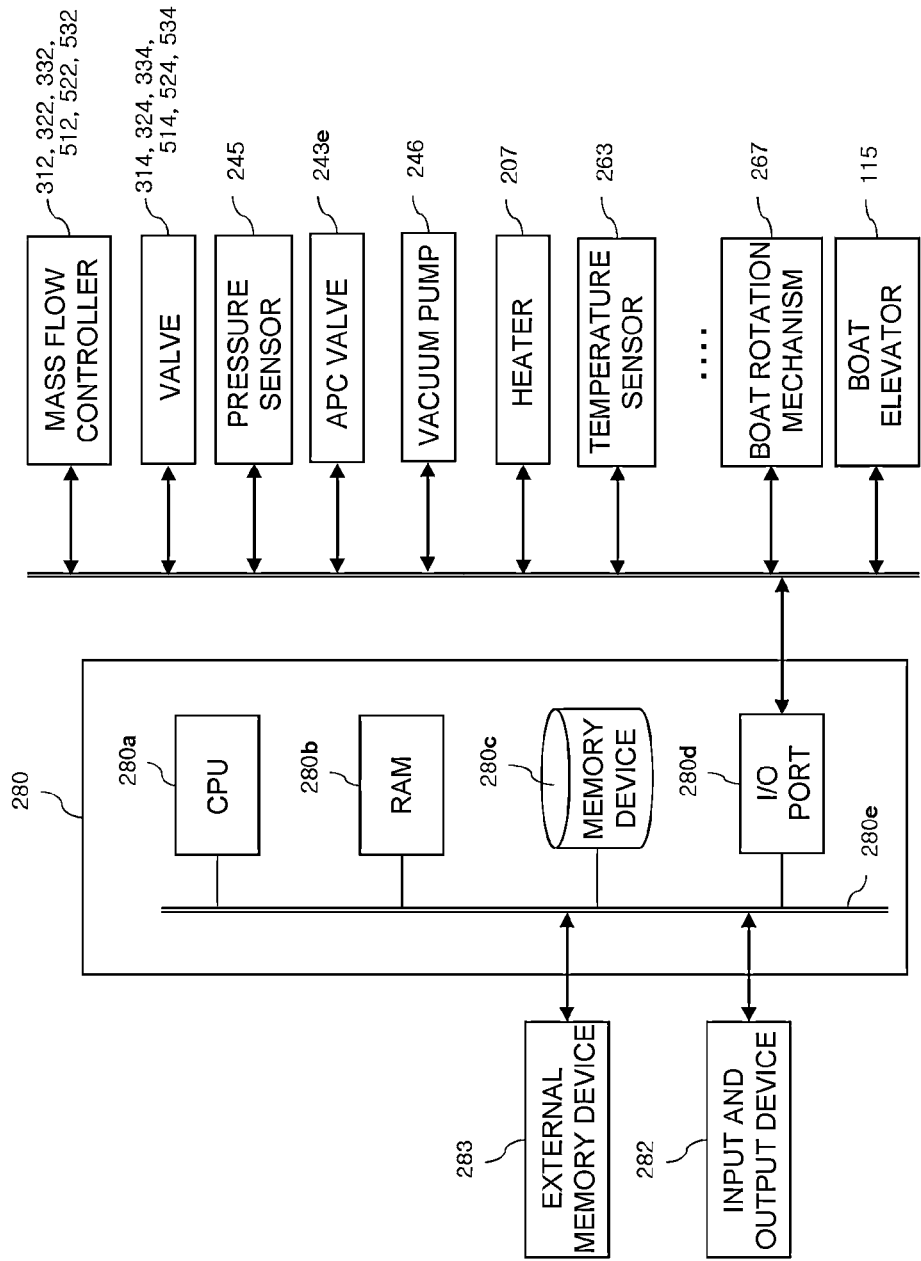
FIG. 4 is a block diagram showing a controller preferably used in a substrate processing apparatus according to an exemplary embodiment of the present invention and each member controlled by the controller.

As shown in FIG. 4, the controller 280 that is a control unit (control means) may include a computer including a Central Processing Unit 280a (CPU), a Random Access Memory 280b (RAM), a memory device 280c, and an I/O port 280d.

The RAM 280b, the memory device 280c, and the I/O port 280d may enable data exchange with the CPU 280a via an inner bus 280e. An input and output device 282 including, for example, a touch panel or the like may be connected to the controller 280.

The memory device 280c includes, for example, a flash memory, a Hard Disk Drive (HDD), or the like. In the memory device 280c, a control program for controlling operations of the substrate processing apparatus or a process recipe in which a substrate processing sequence or condition which will be described below is described may be stored in a recordable manner. In addition, the process recipe may be a combination of the respective sequences of the substrate processing process obtained such that respective sequences are executed by the controller 280 to obtain a predetermined result, and serve as a program. Hereinafter, the process recipe or the control program may be collectively referred to as a program. In addition, when the term of "program" is used in the present specification, only one process recipe may be included, only one program may be included, or both the process recipe and the program may be included. In addition, the RAM 280b may include a memory region (work area) where a program or data read by the CPU 280a is temporarily held.

The I/O port 280d is connected to the above-described mass flow controllers 312, 322, 332, 512, 522, and 532, the valves 314, 324, 334, 514, 524, and 534, the pressure sensor 245, the APC valve 243e, the vacuum pump 246, the heater 207, the temperature sensor 263, the rotation mechanism 267, the boat elevator 115, and the like.

The CPU 280a reads the control program from the memory device 280c to execute the read control program, and reads the process recipe from the memory device 280c by an input or the like of an operational command from the input and output device 282. The CPU 280a may control flow rate adjustment operations of various gases by the mass flow controllers 312, 322, 332, 514, 524, and 534 so as to follow contents of the read process recipe, opening and closing operations of the valves 314, 324, 334, 512, 522, and 532, an opening and closing operation of the APC valve 243e, a pressure adjustment operation based on the pressure sensor 245 by the APC valve 243e, a temperature adjustment operation of the heater 207 based on the temperature sensor 263, activation and stop of the vacuum pump 246, rotation and rotation speed adjustment operations of the boat 217 by the rotation mechanism 267, and an elevation operation of the boat 217 by the boat elevator 115.

In addition, the controller 280 is not limited to a dedicated computer, and may include a general-purpose computer. For example, an external memory device 283 (for example, a magnetic disk such as a magnetic tape, a flexible disk, or a hard disk, and an optical disc such as CD or DVD, a magneto-optical disc such as MO, and a semiconductor memory such as a USB memory or a memory card) where the above-described program is stored is prepared, and a program is installed in the general-purpose computer using the external memory device 280, thereby configuring the controller 280 according to the present embodiment. In addition, a means for supplying a program to a computer is not limited to a case of supplying the program via the external memory device 283. For example, the program may be supplied using a communication means such as the Internet or a dedicated line rather than via the external memory device 283. In addition, the memory device 280c or the external memory device 283 may be configured as a computer-readable recording medium. Hereinafter, these are collectively referred to as a recording medium. In addition, when the term "recording medium" is used in the present specification, only the memory device 280c may be included, only the external memory device 283 may be included, or both the memory device 280c and the external memory device 283 may be included.

Manufacturing Method of Semiconductor Device

Next, an example of forming an insulating film on a substrate when manufacturing a large scale integration (LSI) circuit as one process of the manufacturing processes of the semiconductor device (device) using the above-described processing furnace 202 of the substrate processing apparatus will be described. In addition, in the following description, operations of each member constituting the substrate processing apparatus and the processing furnace of the substrate processing apparatus may be controlled by the controller 280.

In the present embodiment, an example in which a film is formed on a substrate using a plurality of process gases will be described. Specifically, by alternately supplying at least two types of process gases contributing to the film formation together with the catalyst into the process chamber, an example of forming a film on a substrate will be described. Here, "simultaneously supplying the process gas and the catalyst" may refer to a state in which the process gas and the catalyst are simultaneously in the process chamber. That is, a timing of starting to flow the process gas to the process chamber and a timing of starting to flow the catalyst to the process chamber may be the same or different from each other, and a timing of stopping the supply of the process gas and a timing of stopping the supply of the catalyst may be the same or different from each other.

Hereinafter, an example of using a $Si_2Cl_6$ gas that is a silicon-containing gas as a raw gas as the first process gas and using $H_2O$ that is an oxygen-containing gas as a reactive gas as the second process gas will be described. In this case, it is necessary that the catalyst may avoid direct reaction between Cl (base) and the catalyst as a means for avoiding generation (particle generation) of reactive by-products with the silicon-containing gas. In general, a material having a large acid dissociation number tends to be strongly reacted with a material containing group 17 elements such as Cl or the like. Accordingly, it is necessary to select a material having a small acid dissociation number in order to suppress particle. In the present embodiment, an example of selecting and using pyridine (pKa=5.7) as an example of the catalyst will be described.

Figure 5:
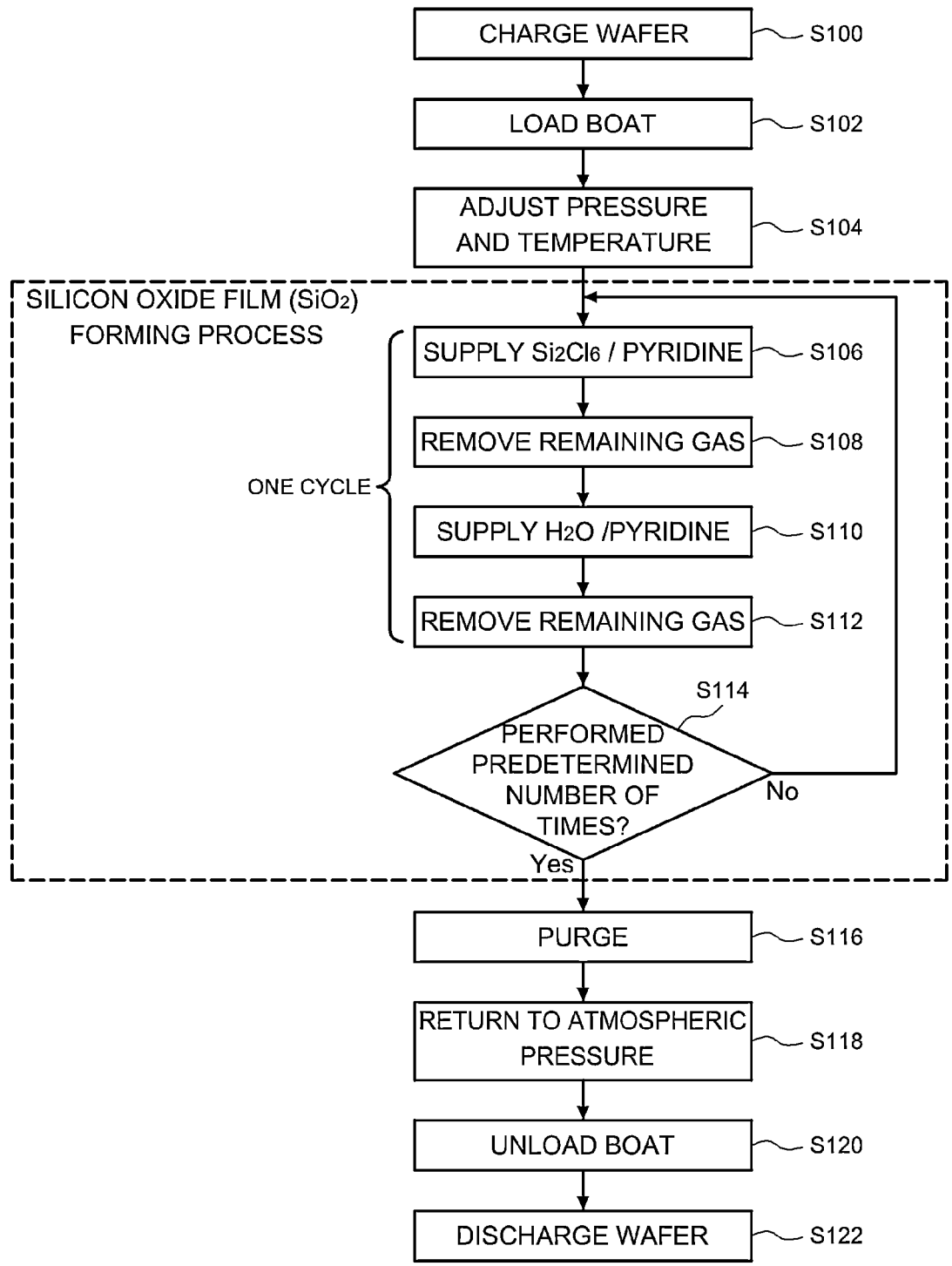
FIG. 5 is a view showing a film forming sequence according to an exemplary embodiment of the present invention.
Figure 6:
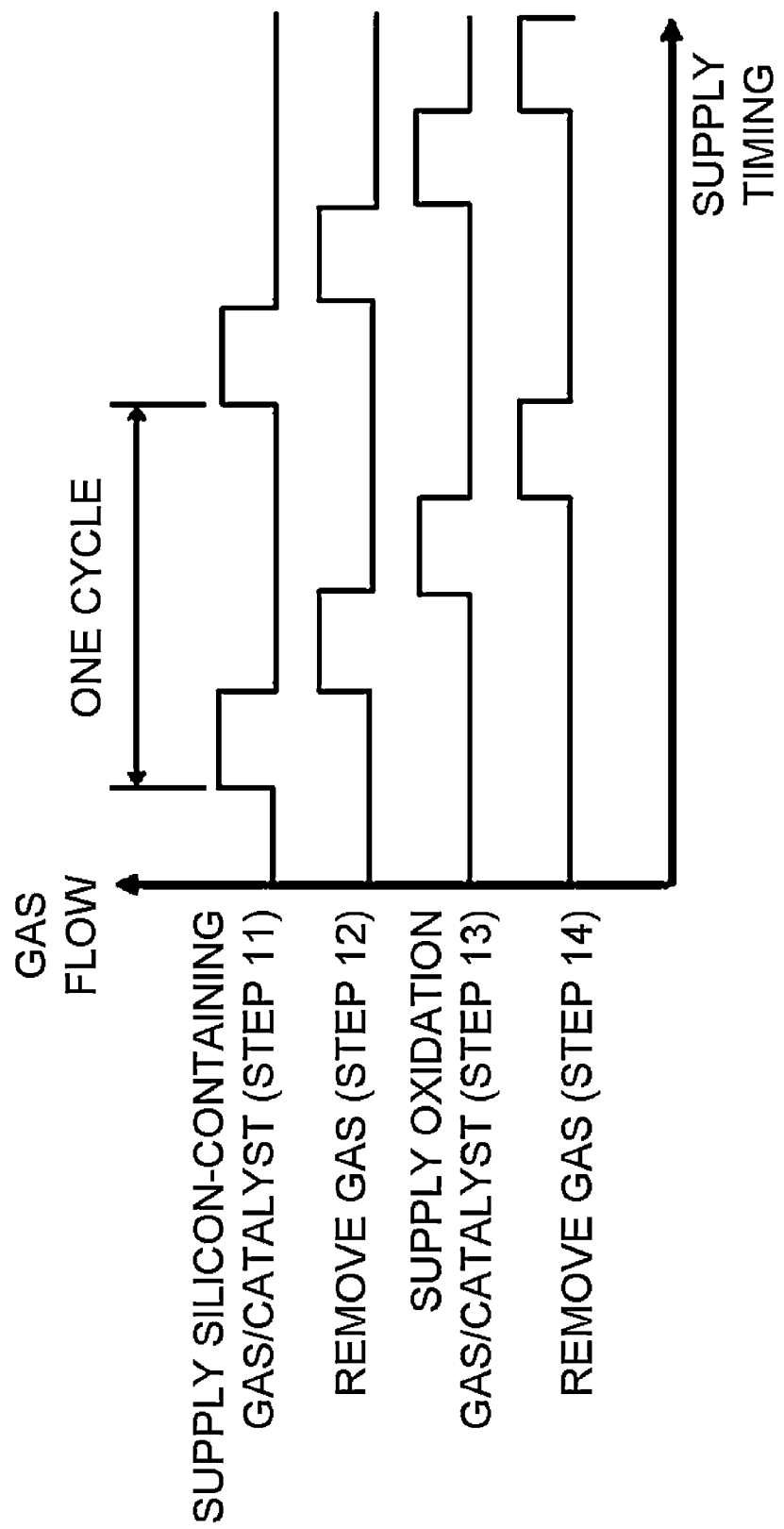
FIG. 6 is a view showing a film forming timing according to an exemplary embodiment of the present invention.

FIG. 5 shows a film forming sequence in the present embodiment, FIG. 6 shows a film forming timing in the present embodiment, and FIG. 7 shows a film forming model in the present embodiment. In the film forming process, the controller 280 controls the substrate processing apparatus 101 as described below. That is, by controlling the heater 207, a temperature in the process chamber 201 may be maintained to be a temperature of room temperature to 200° C., preferably the room temperature to 150° C., and more preferably 100° C.

Step S100 and Step S102

Thereafter, when a plurality of wafers 200 are loaded (wafer charge) in the boat 217 in step S100, the boat 217 supporting the plurality of wafers 200 is elevated by the boat elevator 115, and loaded in (boat load) the process chamber 201 in step S102. In this state, the seal cap 219 seals a bottom surface of the manifold 209 via the O-ring 220.

Step S104

Next, the boat 217 is rotated by the boat rotation mechanism 267 to thereby rotate the wafer 200. Next, when vacuum suction is performed on the inside of the process chamber 201 by the vacuum pump 246 by opening the APC valve 243, and a temperature is stable in such a manner that a temperature of the wafer 200 reaches 100° C., in a state in which the temperature in the process chamber 201 is maintained to be 100° C., four steps which will be described below are sequentially performed.

Step S106

In a state in which a $Si_2Cl_6$ gas is introduced to the gas supply pipe 310, $H_2O$ is introduced to the gas supply pipe 320, pyridine is introduced to the gas supply pipe 330, and $N_2$ is introduced to the inert gas supply pipes 510, 520, and 530, the valves 314, 334, 514, 524, and 534 are appropriately opened. However, the valve 324 is closed.

As a result, the $Si_2Cl_6$ gas and $H_2O$ are mixed, and the mixed gas flows through the gas supply pipe 310 to flow out to the nozzle 410 and is supplied to the process chamber 201 through the gas supply hole 410a. In addition, the pyridine and $N_2$ are mixed, flow through the gas supply pipe 330 to flow out to the nozzle 430, and then are supplied to the process chamber 201 through the gas supply hole 320a. In addition, $N_2$ flows through the inert gas supply pipe 520 to flow out to the nozzle 420, and then is supplied to the process chamber 201 through the gas supply hole 420a. The $Si_2Cl_6$ gas and the pyridine supplied to the process chamber 201 pass over the surface of the wafer 200 to thereby be exhausted through the exhaust pipe 231. Here, by the above-described configuration of the present embodiment, in a state in which the nozzle 430 is arranged in the vicinity of the boat 217 (wafer 200) so that the angle θ1 in the clockwise direction between the first imaginary line L1 and the second imaginary line L2 is in a range equal to or greater than 63.5° and equal to or less than 296.5°, the $Si_2Cl_6$ gas and the pyridine are supplied to the process chamber 201.

In addition, in step S106, by controlling the valves 314 and 334, a time of supplying the $Si_2Cl_6$ gas and the pyridine may be within a range of 1 to 100 seconds, more preferably, within a range of 5 to 30 seconds. In addition, the valves 314 and 334 are controlled so that a ratio of supply amounts (volumetric flow rate) of the $Si_2Cl_6$ gas and the pyridine is a predetermined ratio, and for example, when the ratio is represented as a ratio of $Si_2Cl_6$ gas (sccm)/pyridine (sccm), a ratio of 0.01 to 100 may be used, and more preferably a ratio of 0.05 to 10 may be used. At the same time, by appropriately adjusting the APC valve 243e, a pressure in the process chamber 201 may be maintained to an optimal value (for example, 10 Torr) within a predetermined range.

Figure 7A:
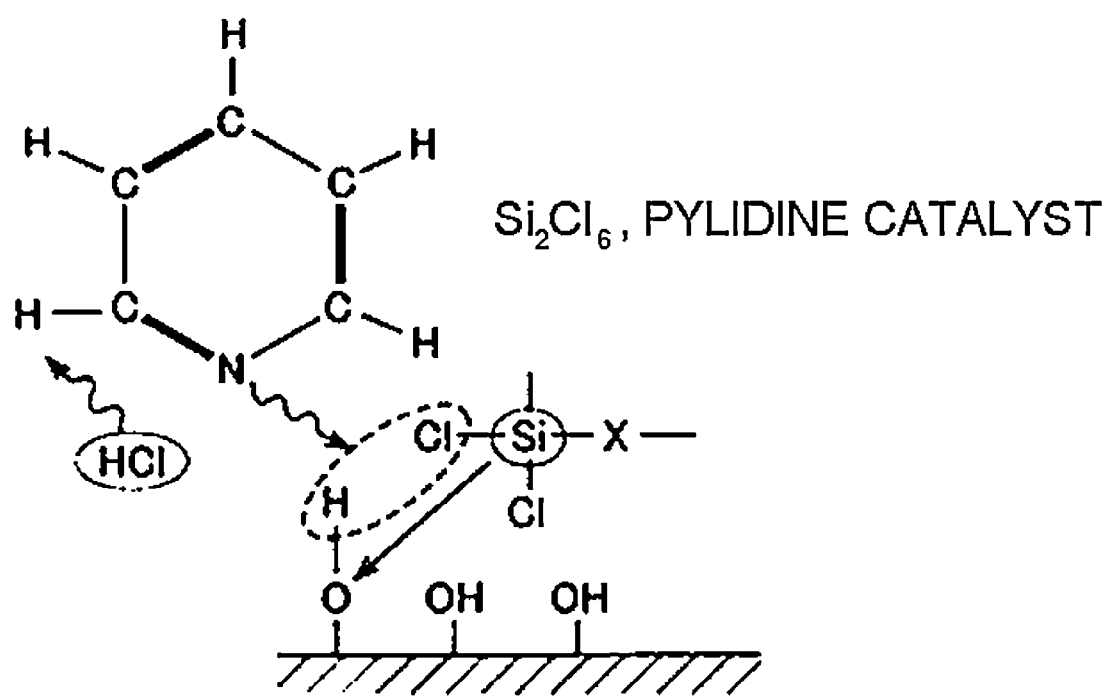
FIGS. 7A and 7B are views showing a film forming model when using pyridine as a catalyst.

In the above-described step S106, by supplying the $Si_2Cl_6$ gas and the pyridine into the process chamber 201, as shown in FIG. 7A, the pyridine is applied to OH bonds formed on the wafer 200, thereby drawing H. That is, a bonding force of OH becomes weaker, HCl gas is desorbed by the reaction between Cl of the $Si_2Cl_6$ gas and H, and the remaining O and Si contained in an intermediate of the $Si_2Cl_6$ gas are combined, and therefore a silicon-containing layer may be formed on the wafer 200.

Step S108

By repeatedly supplying $N_2$ to the process chamber 201 through the inert gas supply pipes 510, 520, and 530 while closing the valves 314 and 334 and stopping the supply of the $Si_2Cl_6$ gas and pyridine, the inside of the process chamber 201 may be purged with $N_2$. A purge time may be, for example, 15 seconds. In addition, two processes of purge and vacuum suction may be performed within 15 seconds. As a result, the $Si_2Cl_6$ gas and pyridine remaining in the process chamber 201 are removed from the inside of the process chamber 201. In this instance, the remaining gas in the process chamber 201 may not be completely removed, and the inside of the process chamber 201 may not be completely purged. When the amount of gas remaining in the process chamber 201 is small, a bad effect may not be generated in step S110 thereafter. Here, a flow rate of the $N_2$ supplied into the process chamber 201 need not be a large flow rate, and for example, an amount of $N_2$ similar to a capacity of the reaction tube 203 (the process chamber 201) can be supplied to perform the purge such that there is no adverse effect occurring in step S110. As described above, as the inside of the process chamber 201 is not completely purged, the purge time can be reduced to improve throughput. In addition, consumption of $N_2$ can be suppressed to a minimal necessity.

Step S110

The valves 324 and 334 are appropriately opened with the valves 514, 524, and 534 open. The valve 314 is in a closed state. As a result, $H_2O$ and $N_2$ are mixed, flow through the gas supply pipe 320 to flow out to the nozzle 420, and then are supplied to the process chamber 201 through the gas supply hole 420a. In addition, the pyridine and $N_2$ are mixed, flow through the gas supply pipe 330 to flow out to the nozzle 430, and then are supplied to the process chamber 201 through the gas supply hole 430a. In addition, $N_2$ flows through the inert gas supply pipe 510 to flow out to the nozzle 410, and then is supplied to the process chamber 201 through the gas supply hole 410a. The $H_2O$ and the pyridine supplied to the process chamber 201 pass over the surface of the wafer 200 to thereby be exhausted through the exhaust pipe 231. Here, by the above-described configuration of the present embodiment, in a state in which the nozzle 430 is arranged in the vicinity of the boat 217 (wafer 200) so that the angle θ1 in the clockwise direction between the third imaginary line L3 and the second imaginary line L2 is in a range equal to or greater than 63.5° and equal to or less than 296.5°, the $H_2O$ and the pyridine are supplied to the process chamber 201.

Figure 7B:
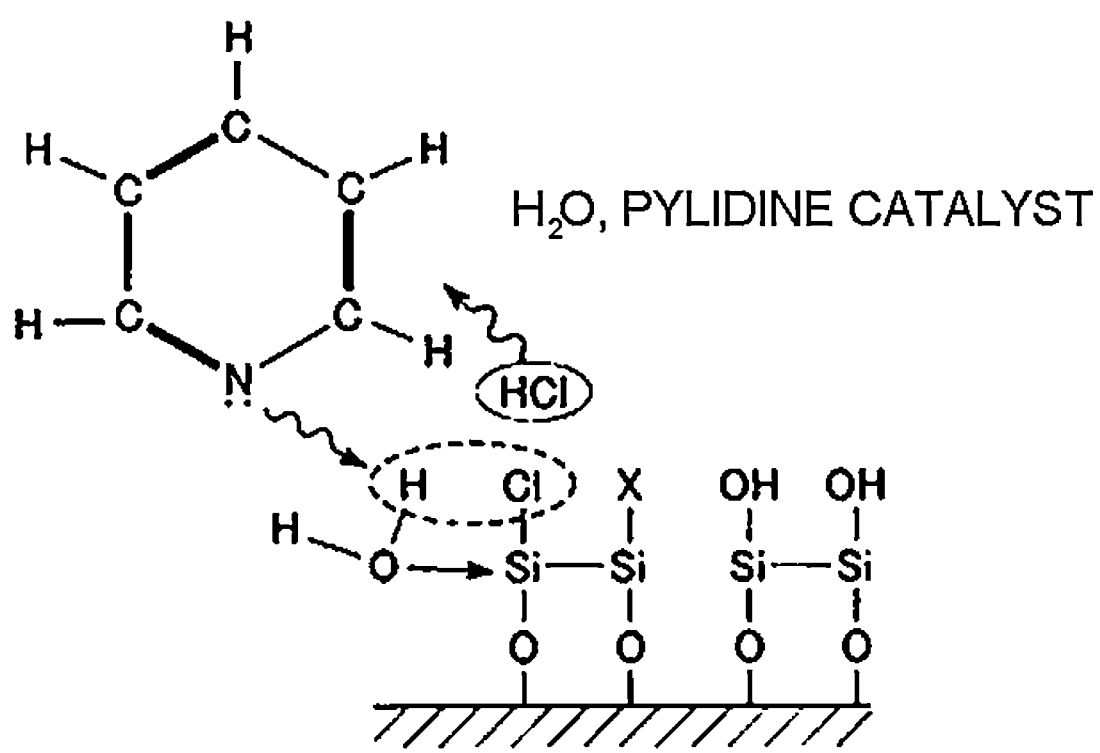

In step S110, by controlling the valves 324 and 334, a time of supplying the $H_2O$ and the pyridine may be within a range of 1 to 100 seconds, more preferably, within a range of 5 to 30 seconds. In addition, the valves 314 and 334 are controlled so that a ratio of supply amounts (volumetric flow rate) of the $H_2O$ and the pyridine is a predetermined ratio, and for example, when the ratio is represented as a ratio of $H_2O$ (sccm)/pyridine (sccm), a ratio of 0.01 to 100 may be used, and more preferably a ratio of 0.05 to 10 may be used. At the same time, by appropriately adjusting the APC valve 243e, a pressure in the process chamber 201 may be maintained to an optimal value (for example, 10 Torr) within a predetermined range. In the above-described step S110, by supplying $H_2O$ and the pyridine into the process chamber 201, as shown in FIG. 7B, the pyridine may be exerted to OH bonds among $H_2O$. Similarly, a bonding force of OH becomes weaker, HCl is desorbed by the reaction with Cl existing on the wafer 200, and then O is combined after the desorbing. In addition, it is more preferable for supply concentrations of the $H_2O$ and the pyridine to be substantially the same. In addition, by supplying the $H_2O$ and the pyridine into the process chamber 201, a $SiO_2$ layer (silicon oxide layer) is formed on the wafer 200.

Step S112

By repeatedly supplying $N_2$ to the process chamber 201 through the inert gas supply pipes 510, 520, and 530 while the valves 324 and 334 are closed and the supply of the $H_2O$ and pyridine is stopped, the inside of the process chamber 201 may be purged with $N_2$. A purge time may be, for example, 15 seconds. In addition, two processes of purge and vacuum suction may be performed within 15 seconds. As a result, the $H_2O$ and pyridine remaining in the process chamber 201 are removed from the inside of the process chamber 201. In this instance, the remaining gas in the process chamber 201 may not be completely removed, and the inside of the process chamber 201 may not be completely purged. When the amount of gas remaining in the process chamber 201 is small, a bad effect may not be generated even in step S106 thereafter. Here, a flow rate of the $N_2$ supplied into the process chamber 201 need not be a large flow rate, and for example, an amount of $N_2$ similar to a capacity of the reaction tube 203 (the process chamber 201) can be supplied to perform the purge such that there is no adverse effect occurring in step S110. Here, a flow rate of the $N_2$ supplied into the process chamber 201 need not be a large flow rate, and for example, an amount of $N_2$ similar to a capacity of the reaction tube 203 (the process chamber 201) can be supplied to perform the purge such that there is no adverse effect occurring in step S106. As described above, as the inside of the process chamber 201 is not completely purged, the purge time can be reduced to improve throughput. In addition, consumption of $N_2$ can be suppressed to a minimal necessity.

Step S114

Thereafter, using steps S106 through S112 as one cycle, a $SiO_2$ film having a predetermined film thickness is formed on the wafer 200 by performing this cycle a plurality of times. In this case, among the respective cycles, it is noted that a film is formed so that an atmosphere configured by the silicon-containing gas and the catalyst in step S106 and an atmosphere configured by the oxygen-containing gas and the catalyst in step S110 are not mixed in the process chamber 201. Therefore, the $SiO_2$ film may be formed on the wafer 200.

When the $SiO_2$ film having a predetermined film thickness is formed on the wafer 200, the inside of the process chamber 201 is at atmospheric pressure through control of the APC valve 243e, and then the boat 217 is unloaded from the process chamber 201. Thereby, one time film forming process (batch process) is completed.

In the above descriptions, an example in which the $Si_2Cl_6$ gas is used as the silicon-containing gas and the $H_2O$ is used as the oxygen-containing gas has been described, but process gases and oxygen-containing gases other than these may be used.

Steps S116 through S122

When a film forming process of forming the $SiO_2$ film with a predetermined film thickness is performed, the inside of the process chamber 201 is purged with an inert gas (gas purge: step S116) by exhausting an atmosphere while supplying the inert gas such as $N_2$ to the process chamber 201. After that, atmosphere in the process chamber 201 is substituted with the inert gas (substitution of the inert gas), and the pressure in the process chamber 201 is returned to a normal pressure (return to atmospheric pressure: step S118). After that, the seal cap 219 is lowered by the boat elevator 115 to open the lower end of the reaction tube 203, and the processed wafer 200 supported by the boat 217 is unloaded to the outside of the process chamber 201 from the lower end of the reaction tube 203 (boat unloading: step S120). Then, the processed wafer 200 is discharged by the boat 217 (wafer discharging: step S122).

By performing the above-described process using the processing furnace 202 of the substrate processing apparatus having the above-described configuration, it is possible to make in-plane distribution of film thickness uniform when forming a film on a substrate using the catalyst.

In addition, by changing a distance (that is, an angle between the first imaginary line connecting the center of the substrate and the gas supply hole and the second imaginary line connecting the center of the substrate and the catalyst supply hole) between the gas supply hole opened in the nozzle for supplying the process gas and the catalyst supply hole for supplying the catalyst, it is possible to control film thickness distribution. For example, by this change, a desired shaped distribution other than a plate shaped distribution may be obtained.

Other Embodiments

Hereinabove, while the embodiments of the present invention have been specifically described, the present invention is not limited to the above-mentioned embodiments but may be varied without departing from the spirit of the present invention. For example, the above-described embodiments may be appropriately combined and carried out. In addition, the following variants may be appropriately combined.

For example, in the present embodiment, an example in which the $SiO_2$ film is formed has been described, but the present invention is not limited thereto. Other silicon-containing films may be applicable as long as the silicon-containing film is a film formed using a catalyst such as a silicon nitride film ($Si_3N_4$ film), a silicon carbon nitride film (SiCN film), or the like. In addition, a case of forming a film containing germanium (Ge) or the like, or a metallic thin film containing a metallic element such as titanium (Ti), tantalum (Ta), cobalt (Co), tungsten (W), molybdenum (Mo), ruthenium (Ru), yttrium (Y), lanthanum (La), zirconium (Zr), hafnium (Hf), aluminum (Al), or the like may be applicable without being limited to the silicon-containing film.

In addition, in the present embodiment, an example in which the $Si_2Cl_6$ gas is used as the silicon-containing gas has been described, but the present invention is not limited thereto. For example, TCS (trichlorosilane, $SiHCl_3$), DCS (dichlorosilane, $SiH_2Cl_2$), TDMAS [tris-dimethylamino silane, $SiH(N(CH_3)_2)_3$], octa-chloro-tri silane ($Si_3Cl_8$), disilazane bicyclo [(CH3) is $SiCl_3$] may be applicable.

In addition, in the present embodiment, an example in which $H_2O$ is used as the oxygen-containing gas has been described, but the present invention is not limited thereto. For example, gases containing an element having a different electro-negativity among a molecule such as $H_2O_2$ or the like may be applicable. In addition, as an oxidation gas, $H_2O$, $H_2O_2$, $H_2+O_2$ mixed plasma, $H_2+O_3$, and the like including OH bonds may be used.

In addition, in the present embodiment, an example in which the pyridine is used as the catalyst has been described, but the present invention is not limited thereto. For example, a material in which N is combined with a heterocycle, such as amino pyridine, picoline, piperazine, or lutidine may be applicable.

In addition, the above-described gas may be used as the silicon-containing gas when applied to the $Si_3N_4$ film. As the nitrogen (N)-containing gas, a gas containing an element having a different electro-negativity among a molecule, such as ammonia ($NH_3$), $N_2H_4$, $(CH_3)N_2H_3$, $(CH_3)_2N_2H_2$, or the like, and a material including NH bonds may be used.

In addition, in the present embodiment, a case in which the substrate processing apparatus 101 is a vertical batch apparatus has been described, but the present invention is not limited thereto. For example, a case in which the substrate processing apparatus 101 is a sheet device for processing one or multiple pieces of substrates or a transverse device may be applicable.

In addition, the present invention may be realized by changing the process recipe of the existing substrate processing apparatus. When changing the process recipe, the process recipe according the present invention may be installed in the existing substrate processing apparatus via a telecommunication line or a recording medium where the process recipe is recorded, or an input and output device of the existing substrate processing apparatus may be adjusted, thereby changing the process recipe itself to the process recipe according to the present invention.

EXAMPLES

Hereinafter, examples will be described, but the invention is not limited thereto.

Example 1

In Example 1, a $SiO_2$ film was formed using the processing furnace 202 of the substrate processing apparatus shown in FIG. 1. In Example 1, using a configuration of the processing furnace shown in FIG. 2, that is, the configuration of the processing furnace 202 in which the angle θ1 between the first imaginary line L1 and the second imaginary line L2 and the angle θ2 between the third imaginary line L3 and the second imaginary line L2 are the same angle which is close to 180° (near 176°), the $SiO_2$ film was formed. In addition, in Example 1, the $SiO_2$ film was formed on each of three flat wafers without a pattern, which were formed on a lower portion, a middle portion, and an upper portion of the boat 217.

Specifically, in film forming of the $SiO_2$ film according to Example 1, a $Si_2Cl_6$ gas was supplied from the nozzle 410 of the gas supply pipe 310, $H_2O$ was supplied from the nozzle 420 of the gas supply pipe 320, and pyridine was supplied from the nozzle 430 of the gas supply pipe 330. Film forming conditions of the $SiO_2$ film are shown in the following Table 1.

TABLE 1

| Substrate temperature | 90° C. | |
|---|---|---|
| Pressure in furnace | 7 Torr | |
| Flow rate | Silicon-containing gas: $Si_2Cl_6$ | 0.5 slm |
| | Oxygen-containing gas: $H_2O$ | 2.0 slm |
| | Catalyst: pyridine | 0.75 slm |
| | Number of cycles | 50 cycles |

Example 2

In Example 2, a $SiO_2$ film was formed using the processing furnace 202 of the substrate processing apparatus shown in FIG. 1. In Example 2, using a configuration of the processing furnace 202 shown in FIG. 3 in which the angle θ1 between the first imaginary line L1 and the second imaginary line L2 is approximately 63.5° and the angle θ2 between the third imaginary line L3 and the second imaginary line L2 is approximately 269.5°, the $SiO_2$ film was formed. In addition, in Example 2, the $SiO_2$ film was formed on each of three flat wafers without a pattern, which were formed on a lower portion, a middle portion, and an upper portion of the boat 217. In addition, film forming conditions such as a film forming temperature, a pressure, and a flow rate were the same as in Example 1. However, the number of cycles was about three times that of Example 1.

Comparative Example 1

In Comparative Example 1, a $SiO_2$ film was formed using the processing furnace 202 of the substrate processing apparatus shown in FIG. 1. In Comparative Example 1, using a configuration of the processing furnace 202 shown in FIG. 14 in which a nozzle 1010 of a gas supply pipe 910, a nozzle 1020 of a gas supply pipe 920, and a nozzle 1030 of a gas supply pipe 930 are arranged close to each other along a cylindrical side wall of the process chamber 201, the $SiO_2$ film was formed. In addition, in Comparative Example 1, the $SiO_2$ film was formed on each of three flat wafers without a pattern, which were formed on a lower portion, a middle portion, and an upper portion of the boat 217. In addition, film forming conditions such as a film forming temperature, a pressure, and a flow rate were the same as in Example 1.

Evaluation of In-Plane Distribution of Film Thickness

As described above, the $SiO_2$ film according to Example 1 was formed, and then in-plane distribution of film thickness of the $SiO_2$ film was measured (evaluated).

Figure 8A:
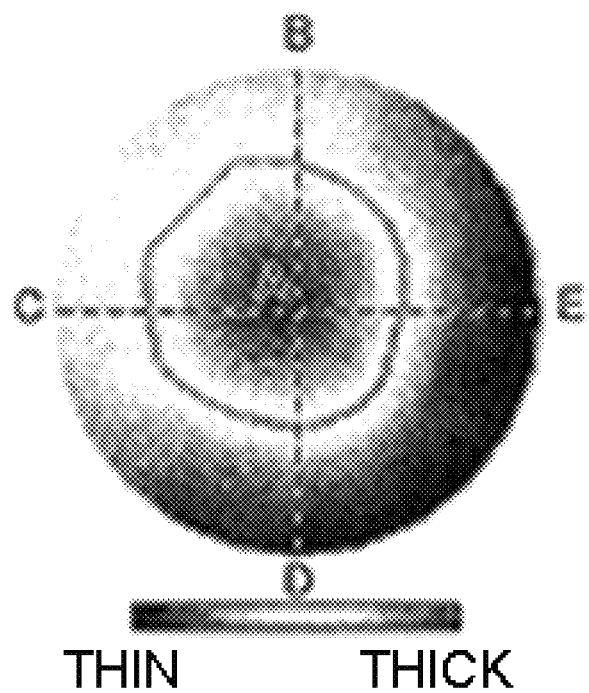
FIGS. 8A through 8C are views showing in-plane distribution of film thickness of a $SiO_2$ film according to Example 1.
Figure 8B:
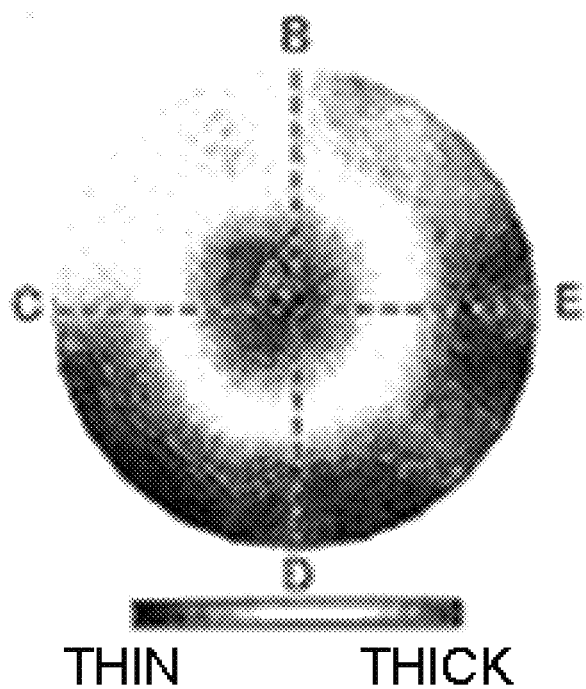
Figure 8C:
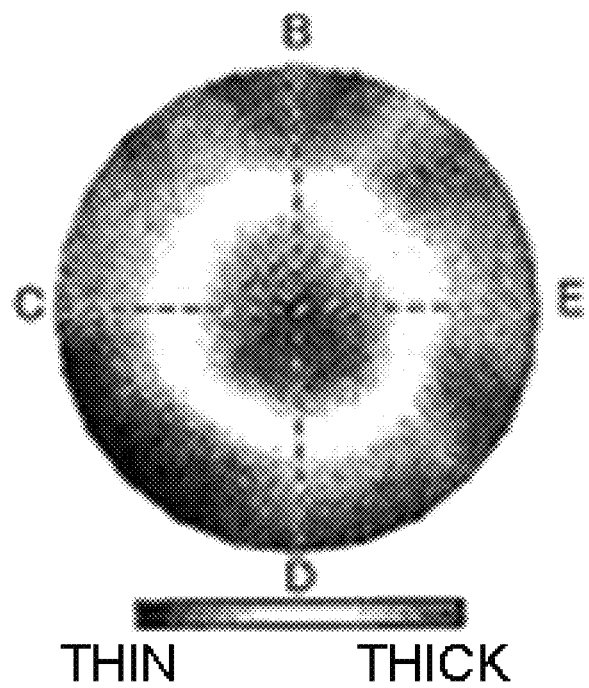

FIGS. 8A through 8C are views showing in-plane distribution of film thickness of a $SiO_2$ film according to Example 1. Here, FIG. 8A is a view showing in-plane distribution of film thickness of the $SiO_2$ film formed on a flat wafer formed in an upper portion of the boat 217, FIG. 8B is a view showing in-plane distribution of film thickness of the $SiO_2$ film formed on the wafer formed in a middle portion of the boat 217, and FIG. 8C is a view showing in-plane distribution of film thickness of the $SiO_2$ film formed on the wafer formed in a lower portion of the boat 217.

Figure 9A:
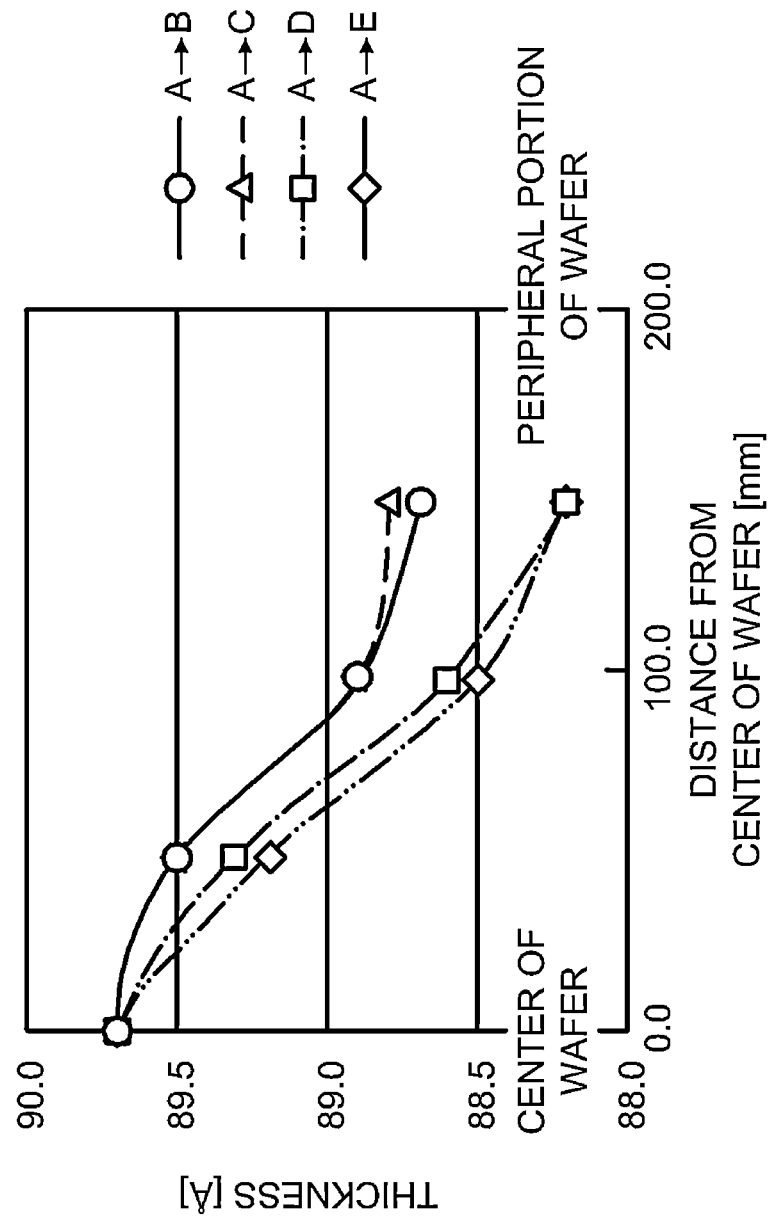
FIGS. 9A through 9C are graphs showing correlation between a distance and a thickness in the in-plane distribution of film thickness of a $SiO_2$ film according to Example 1.
Figure 9B:
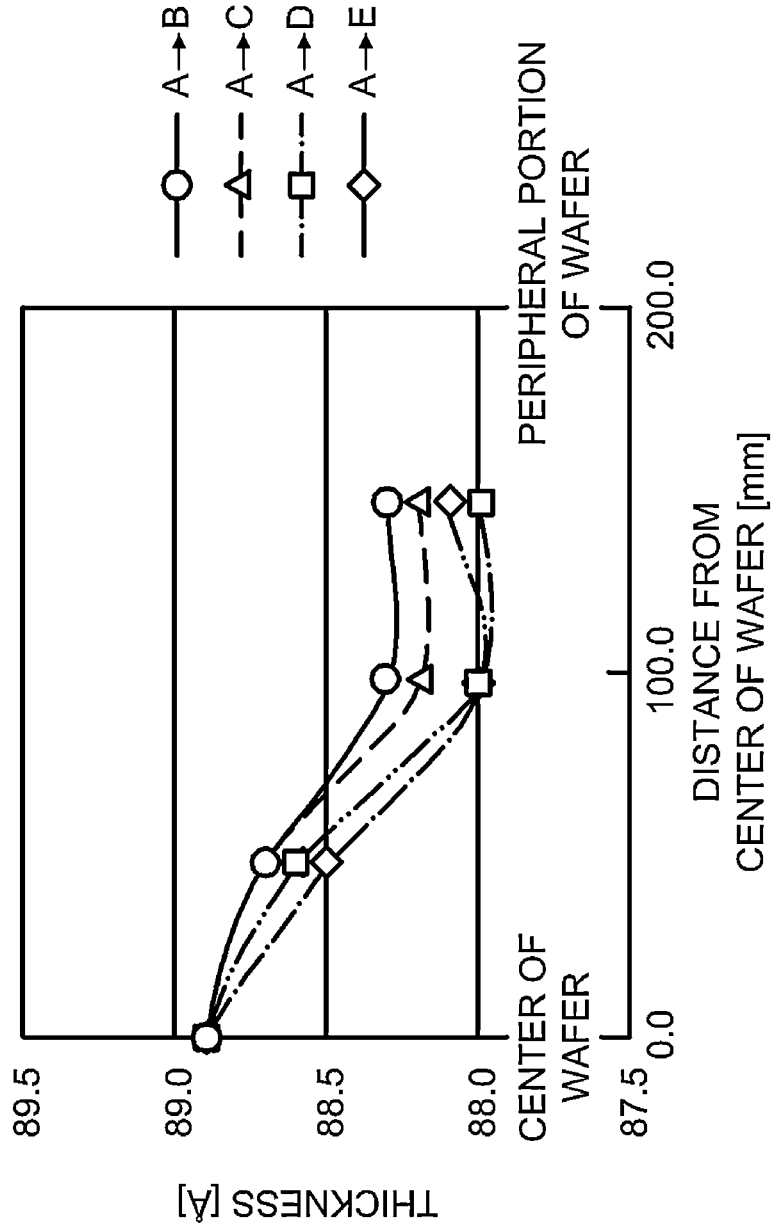
Figure 9C:
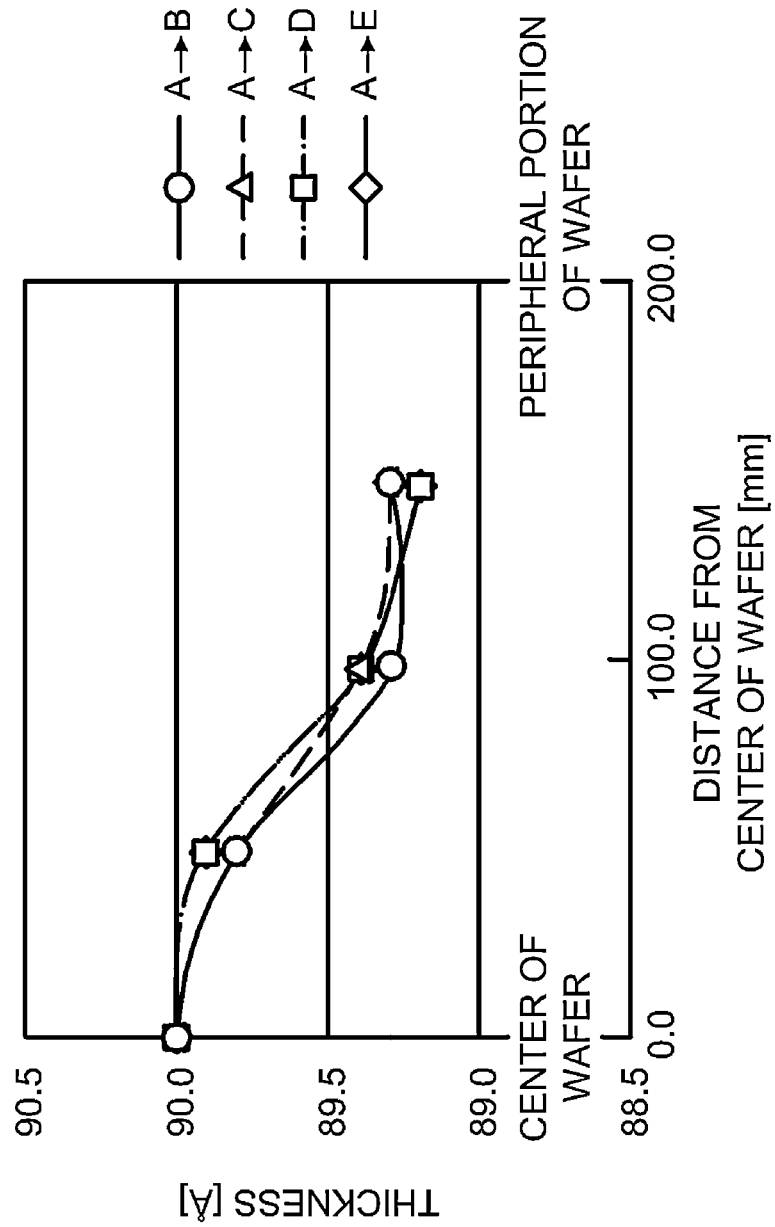

FIGS. 9A through 9C are graphs showing correlation between a distance and a thickness in the in-plane distribution of film thickness of a $SiO_2$ film according to Example 1. Here, FIG. 9A shows correlation between a distance and a thickness in the in-plane distribution of film thickness shown in FIG. 8A, FIG. 9B shows correlation between a distance and a thickness in the in-plane distribution of film thickness shown in FIG. 8B, and FIG. 9C shows correlation between a distance and a thickness in the in-plane distribution of film thickness shown in FIG. 8C.

Figure 10A:
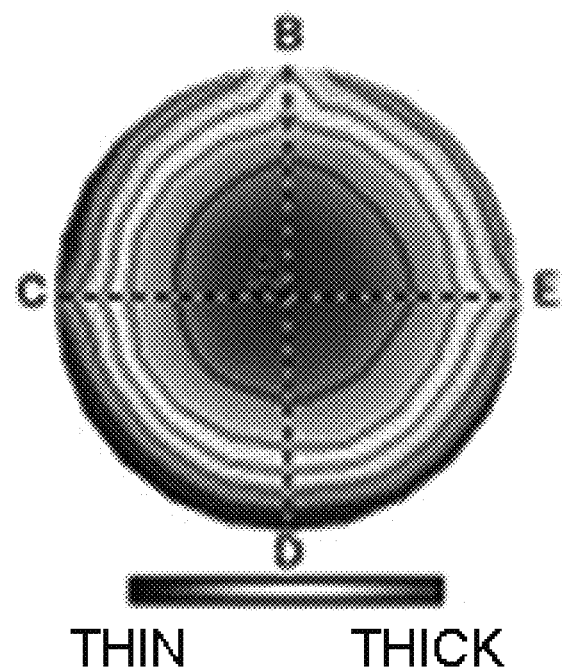
FIGS. 10A through 10C are views showing in-plane distribution of film thickness of a silicon oxide film according to Example 2.
Figure 10B:
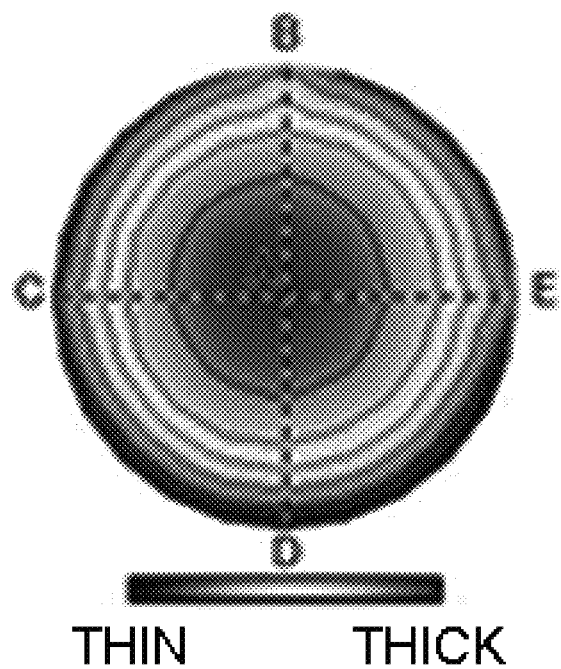
Figure 10C:
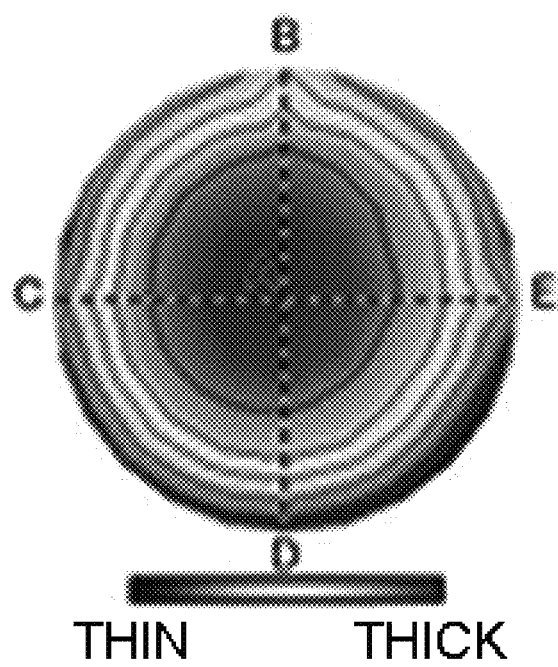

FIGS. 10A through 10C are views showing in-plane distribution of film thickness of a silicon oxide film according to Example 2. Here, FIG. 10A shows in-plane distribution of film thickness of the $SiO_2$ film formed on the flat wafer provided on an upper portion of the boat 217, FIG. 10B shows in-plane distribution of film thickness of the $SiO_2$ film formed on the flat wafer provided on a middle portion of the boat 217, and FIG. 10C shows in-plane distribution of film thickness of the $SiO_2$ film formed on the flat wafer provided on a lower portion of the boat 217.

Figure 11A:
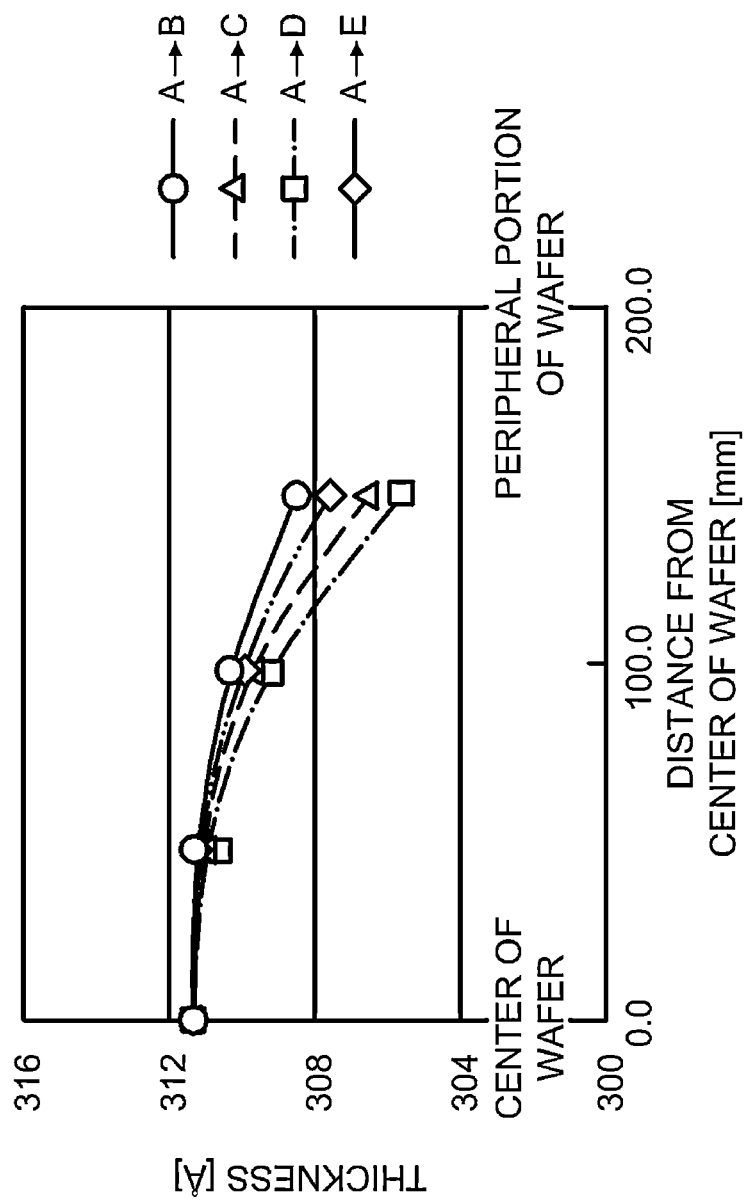
FIGS. 11A through 11C are graphs showing correlation between a distance and a thickness in in-plane distribution of film thickness of a $SiO_2$ film according to Example 2.
Figure 11B:
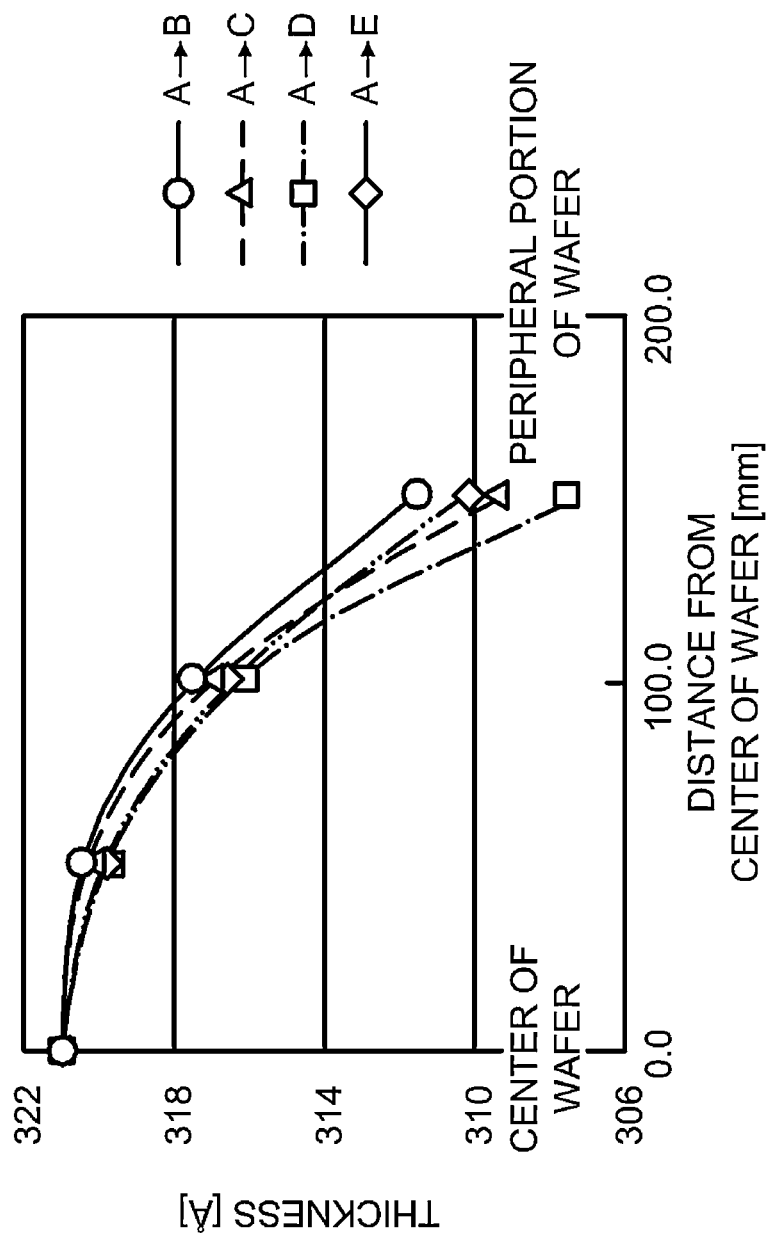
Figure 11C:
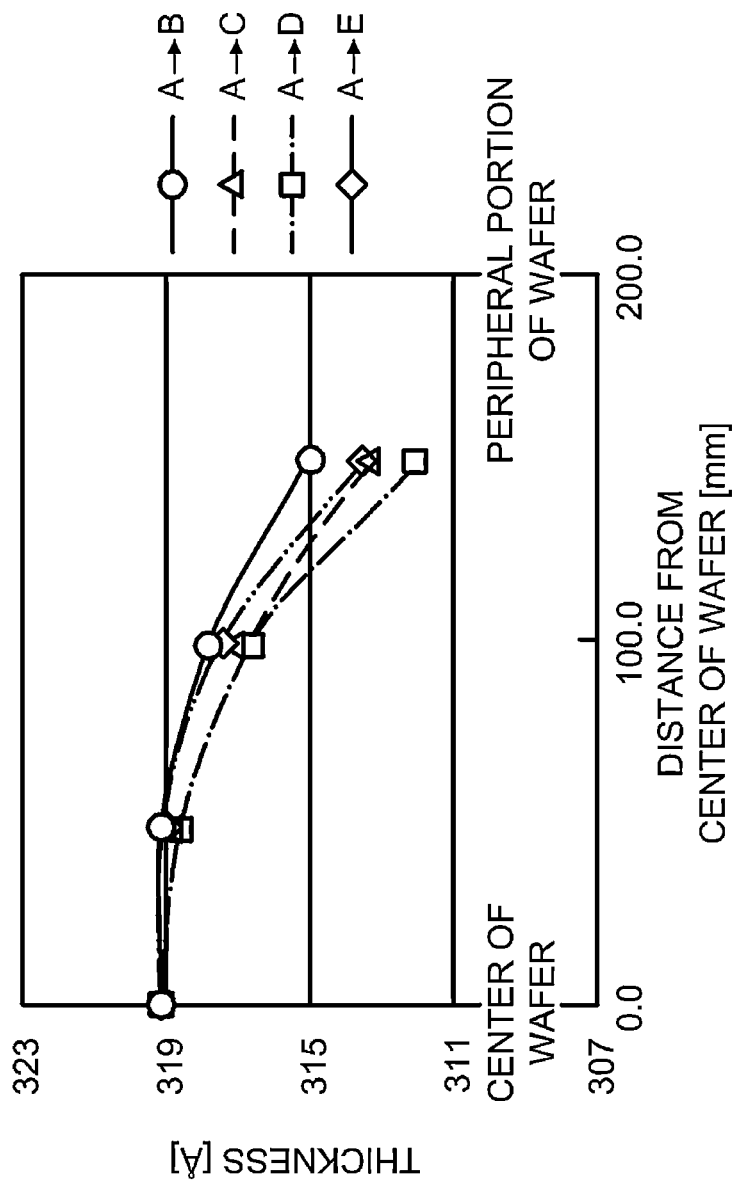

FIGS. 11A through 11C are graphs showing correlation between a distance and a thickness in in-plane distribution of film thickness of a $SiO_2$ film according to Example 2. Here, FIG. 11A shows correlation between a distance and a thickness in the in-plane distribution of film thickness shown in FIG. 10A, FIG. 11B shows correlation between a distance and a thickness in the in-plane distribution of film thickness shown in FIG. 10B, and FIG. 11C shows correlation between a distance and a thickness in the in-plane distribution of film thickness shown in FIG. 10C.

Figure 12A:
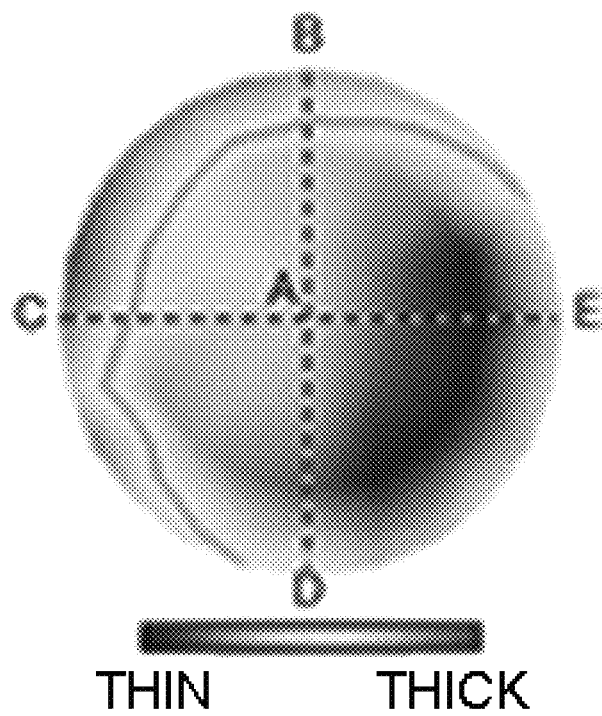
FIGS. 12A through 12C are views showing in-plane distribution of film thickness of a $SiO_2$ film according to Comparative Example 1.
Figure 12B:
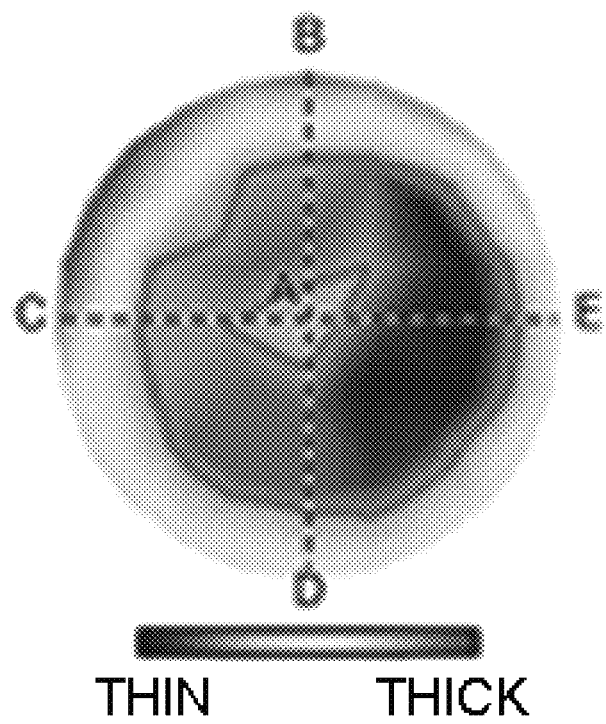
Figure 12C:
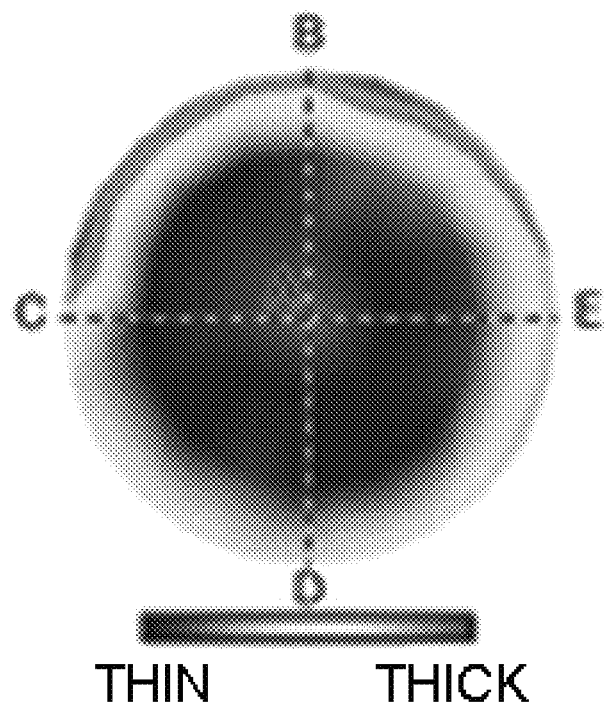

FIGS. 12A through 12C are views showing in-plane distribution of film thickness of a $SiO_2$ film according to Comparative Example 1. Here, FIG. 12A shows the in-plane distribution of film thickness of the $SiO_2$ film formed on the flat wafer provided on an upper portion of the boat 217, FIG. 12B shows the in-plane distribution of film thickness of the $SiO_2$ film formed on the flat wafer provided on a middle portion of the boat 217, and FIG. 12C shows the in-plane distribution of film thickness of the $SiO_2$ film formed on the flat wafer provided on a lower portion of the boat 217.

Figure 13B:
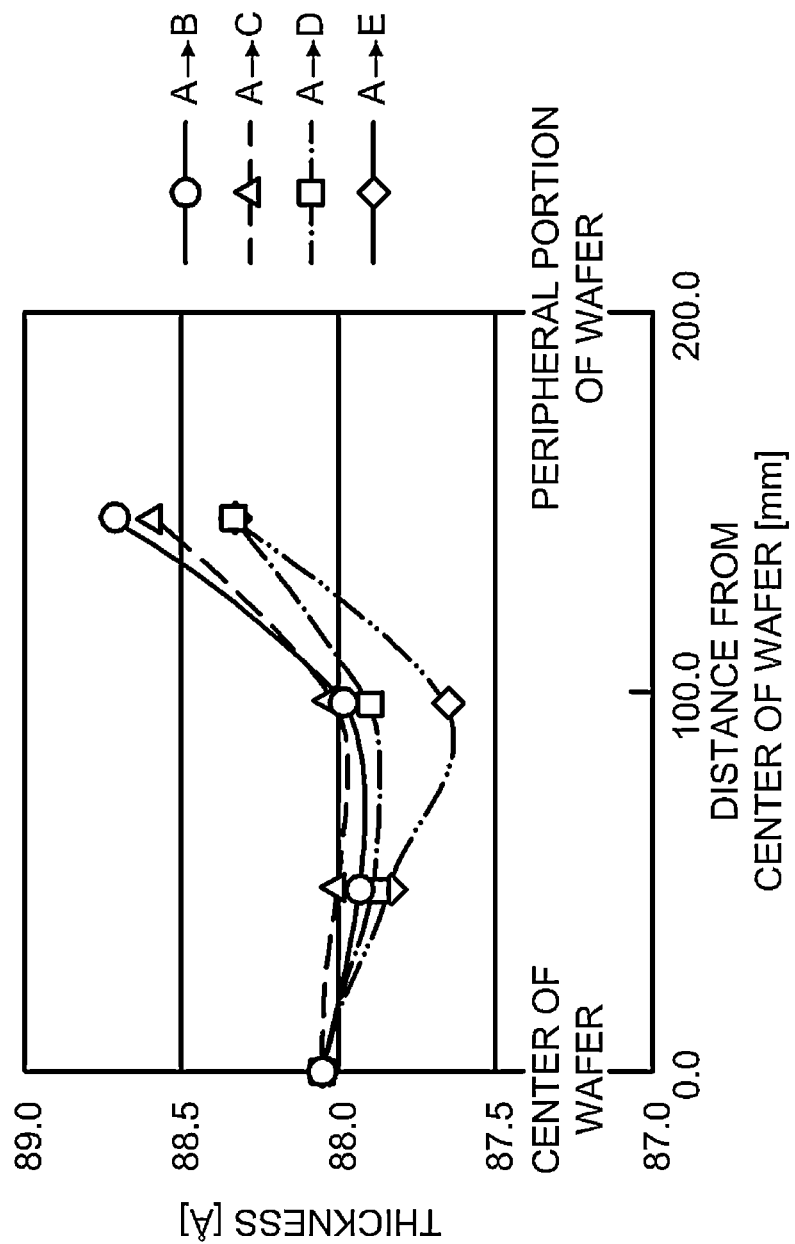
Figure 13C:
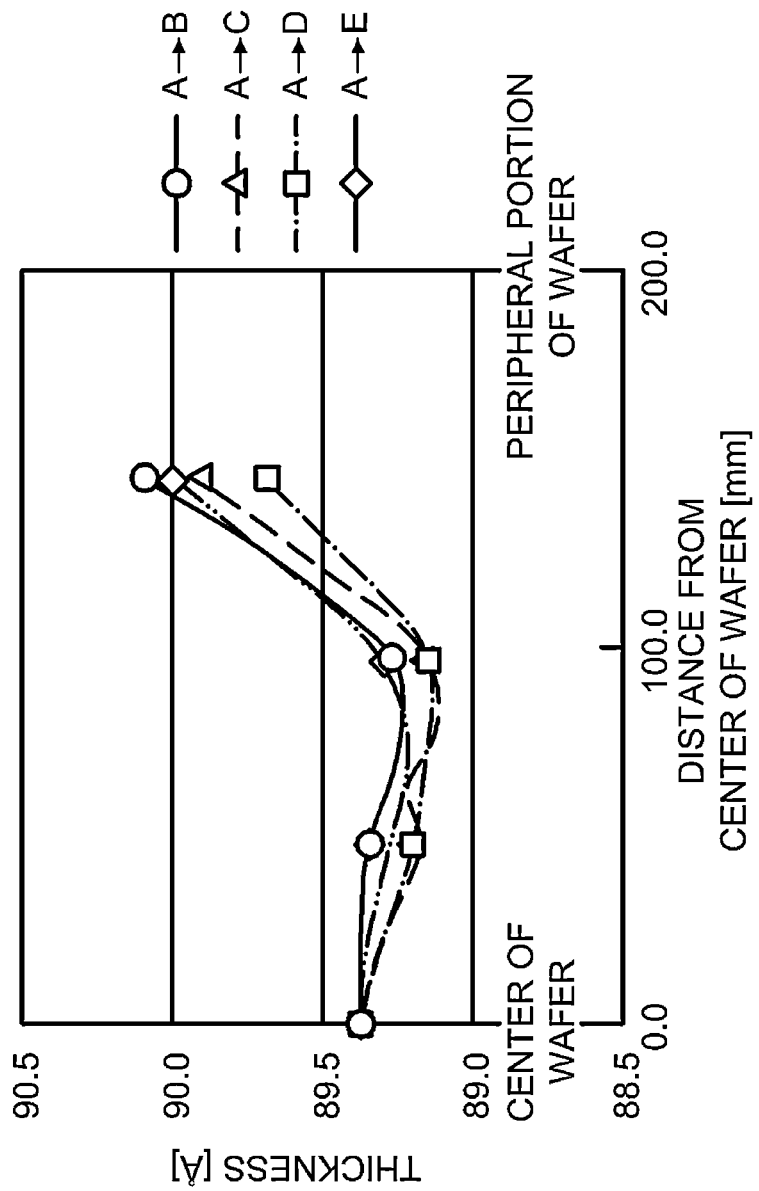

FIGS. 13A through 13C are graphs showing correlation between a distance and a thickness in in-plane distribution of film thickness of a $SiO_2$ film according to Comparative Example 1. Here, FIG. 13A shows correlation between a distance and a thickness in the in-plane distribution of film thickness shown in FIG. 12A, FIG. 13B shows correlation between a distance and a thickness in the in-plane distribution of film thickness shown in FIG. 12B, and FIG. 13C shows correlation between a distance and a thickness in the in-plane distribution of film thickness shown in FIG. 12C.

In addition, the film thickness [Å] (a maximum film thickness/a minimum film thickness) of the $SiO_2$ film according to Examples 1 and 2 and Comparative Example 1 and in-plane uniformity of film thickness [%] were obtained, which are shown in Table 2.

TABLE 2

| Position of wafer | | Upper portion | Middle portion | Lower portion |
|---|---|---|---|---|
| Example 1 | film thickness [Å] (maximum/minimum) | 88.7 (89.7/88.2) | 88.2 (88.9/87.8) | 89.4 (90.0/89.1) |
| | in-plane uniformity of film thickness [%] | ±0.84 | ±0.61 | ±0.54 |
| Example 2 | film thickness [Å] (maximum/minimum) | 308 (311/305) | 314 (321/308) | 315 (319/311) |
| | in-plane uniformity of film thickness [%] | ±0.96 | ±2.17 | ±1.20 |
| Comparative Example 1 | film thickness [Å] (maximum/minimum) | 89.9 (90.6/89.3) | 88.2 (88.8/87.7) | 89.6 (90.3/89.2) |
| | in-plane uniformity of film thickness [%] | ±0.72 | ±0.65 | ±0.63 |

As shown in FIGS. 8 through 13, it can be found that, compared to the $SiO_2$ film of Comparative Example 1, a film thickness of the $SiO_2$ film according to Examples 1 and 2 becomes thicker across from an outer peripheral portion of the wafer to the center portion thereof. This may be regarded as due to the fact that a ratio in which pyridine and a $Si_2Cl_6$ gas or $H_2O$ are mixed in the center portion of the wafer is increased and therefore distribution in which the film thickness becomes thicker across the outer peripheral portion of the wafer to the center portion thereof may be obtained.

In addition, referring to Examples 1 and 2, it can be found that the film thickness becomes thicker only in the center portion of the wafer. As shown in FIG. 2, this may be regarded as due to the fact that the nozzle 410 of the gas supply pipe 310 and the nozzle 420 of the gas supply pipe 320 are arranged close to each other, and the nozzle 430 of the gas supply pipe 330 is arranged in a position substantially opposite to the nozzle 410 of the gas supply pipe 310 and the nozzle 420 of the gas supply pipe 320 via the boat 217 (wafer 200 held by the boat 217), and therefore a ratio in which various gases are mixed may be increased in the center portion of the wafer.

Meanwhile, in Example 2, it can be found that a film thickness becomes thicker from the center portion of the wafer to a middle portion, and a film thickness becomes thicker in a stepwise manner across from the outer peripheral portion of the wafer to the center portion thereof. This may be regarded as due to the fact that, as shown in FIG. 3, the nozzle 410 of the gas supply pipe 310 and the nozzle 420 of the gas supply pipe 320 are arranged close to each other, arranged with a predetermined interval therebetween so that the angle θ1 is substantially 63.5° or 296.5°, and arranged with a predetermined interval therebetween so that the angle θ2 is substantially 296.5° or 63.5°, and therefore a ratio in which various gases are mixed across from the outer peripheral portion of the wafer to the center portion thereof may be increased in a stepwise manner. The film thickness distribution may be more preferable in Example 2 than in Example 1. The may be regarded as due to the fact that a density of a typical pattern has no difference in the outer peripheral portion of the wafer and the center portion thereof, gas consumption is nearly constant across from the outer peripheral portion of the wafer to the center portion thereof, and a reduction in the film thickness due to the gas consumption is nearly constant across from the outer peripheral portion of the wafer to the center portion thereof, and therefore the film thickness is increased in a stepwise manner across from the outer peripheral portion of the wafer to the center portion thereof, thereby making the film thickness uniform.

According to the present invention, in-plane distribution of film thickness of a thin film formed on a substrate can be made uniform.

Exemplary Aspects of the Invention

Hereinafter, exemplary aspects of the present invention will be supplementarily noted.

Supplementary Note 1

According to an aspect of the present invention, there is provided a substrate processing apparatus including: a process chamber configured to accommodate a substrate; a first gas supply system including a first gas supply hole for supplying a first process gas into the process chamber; a second gas supply system including a second gas supply hole for supplying a second process gas into the process chamber; and a catalyst supply system including a catalyst supply hole for supplying a catalyst into the process chamber, wherein an angle between a first imaginary line connecting a center of the substrate and the first gas supply hole and a second imaginary line connecting the center of the substrate and the catalyst supply hole ranges from 63.5 degrees to 296.5 degrees.

Supplementary Note 2

Preferably, an angle between the second imaginary line and a third imaginary line connecting the center of the substrate and the second gas supply hole ranges from 63.5 degrees to 296.5 degrees.

Supplementary Note 3

Preferably, each of a distance between the first gas supply hole and the catalyst supply hole and a distance between the second gas supply hole and the catalyst supply hole is greater than a distance between the first gas supply hole and the second gas supply hole.

Supplementary Note 4

Preferably, a distance between the first gas supply hole and the catalyst supply hole and a distance between the second gas supply hole and the catalyst supply hole are substantially same.

Supplementary Note 5

Preferably, each of the first gas supply hole and the second gas supply hole is provided in a position substantially opposite to the catalyst supply hole with the substrate interposed therebetween.

Supplementary Note 6
Preferably, the first process gas includes a silicon-containing gas, and the second process gas includes one of an oxygen-containing gas and a nitrogen-containing gas.

Supplementary Note 7
Preferably, the catalyst is a combination of a heterocycle and nitrogen, and includes one of pyridine, amino pyridine, picoline, piperazine and lutidine.

Supplementary Note 8
Preferably, the process chamber further accommodates a plurality of substrates, and the first gas supply system, the second gas supply system and the catalyst supply system includes a first nozzle, a second nozzle and a third nozzle, respectively, each of the first nozzle, the second nozzle and the third nozzle extending in a stacked direction of the plurality of substrates in the process chamber, and including a plurality of supply holes provided along the stacked direction of the plurality of substrates.

Supplementary Note 9
Preferably, a surface of the substrate includes a pattern.

Supplementary Note 10
According to another aspect of the present invention, there is provided a method of manufacturing a semiconductor device, including: a first process of supplying a first process gas and a catalyst into a process chamber accommodating a substrate therein through a first gas supply hole provided in a first process gas supply system and a catalyst through a catalyst supply hole provided in a catalyst supply system, respectively, the first gas supply hole and the catalyst supply hole being arranged in a manner that an angle between a first imaginary line connecting a center of the substrate and the first gas supply hole and a second imaginary line connecting the first imaginary line and a center of the substrate ranges from 63.5 degrees to 296.5 degrees; and a second process of supplying a second process gas and the catalyst into the process chamber through a second gas supply hole provided in a second process gas supply system and the catalyst supply hole, respectively.

Supplementary Note 11
Preferably, the catalyst supply hole is arranged in a manner that an angle between a third imaginary line connecting the center of the substrate and the second gas supply hole and the second imaginary line ranges from 63.5 degrees to 296.5 degrees.

Supplementary Note 12
Preferably, each of a distance between the first gas supply hole and the catalyst supply hole and a distance between the second gas supply hole and the catalyst supply hole is greater than a distance between the first gas supply hole and the second gas supply hole.

Supplementary Note 13
Preferably, a distance between the first gas supply hole and the catalyst supply hole and a distance between the second gas supply hole and the catalyst supply hole are substantially same.

Supplementary Note 14
Preferably, each of the first gas supply hole and the second supply hole is provided in a position substantially opposite to the catalyst supply hole with the substrate interposed therebetween.

Supplementary Note 15
Preferably, the first process gas includes a silicon-containing gas, and the second process gas includes one of an oxygen-containing gas and a nitrogen-containing gas.

Supplementary Note 16
Preferably, the catalyst is a combination of a heterocycle and nitrogen, and includes one of pyridine, amino pyridine, picoline, piperazine, and lutidine.

Supplementary Note 17
Preferably, the process chamber further accommodates a plurality of substrates, and the first gas supply system, the second gas supply system and the catalyst supply system includes a first nozzle, a second nozzle and a third nozzle, respectively, each of the first nozzle, the second nozzle and the third nozzle extending in a stacked direction of the plurality of substrates in the process chamber, and including a plurality of supply holes provided along the stacked direction of the plurality of substrates.

Supplementary Note 18
Preferably, a surface of the substrate includes a pattern.

Supplementary Note 19
According to another aspect of the present invention, there is provided a program that causes a computer to perform sequences of: supplying a first process gas and a catalyst into a process chamber accommodating a substrate through a first gas supply hole provided in a first process gas supply system and a catalyst supply hole provided in a catalyst supply system, respectively, the first gas supply hole and the catalyst supply hole being arranged in a manner that an angle between a first imaginary line connecting a center of the substrate and the first gas supply hole and a second imaginary line connecting the first imaginary line and a center of the substrate ranges from 63.5 degrees to 296.5 degrees; and supplying a second process gas and the catalyst into the process chamber through a second gas supply hole provided in a second process gas supply system and the catalyst supply hole, respectively.

Supplementary Note 20
Preferably, there is provided a non-transitory computer readable recording medium storing the program.

Supplementary Note 21
Preferably, there is provided a substrate processing apparatus including the recording medium.

What is claimed is:

1. A substrate processing apparatus comprising:
a process chamber configured to accommodate a substrate;
a substrate holding member configured to hold the substrate in the process chamber;
a first gas supply system including a first gas supply hole for supplying a first process gas into the process chamber;
a second gas supply system including a second gas supply hole for supplying a second process gas into the process chamber; and
a catalyst supply system including a catalyst supply hole for supplying a catalyst into the process chamber,
wherein an angle between a first imaginary line connecting a center of the substrate holding member and the first gas supply hole and a second imaginary line connecting the center of the substrate holding member and the catalyst supply hole ranges from 63.5 degrees to 296.5 degrees.

2. The substrate processing apparatus according to claim 1, wherein an angle between the second imaginary line and a third imaginary line connecting the center of the substrate holding member and the second gas supply hole ranges from 63.5 degrees to 296.5 degrees.

3. The substrate processing apparatus according to claim 1, wherein each of a distance between the first gas supply hole and the catalyst supply hole and a distance between the second gas supply hole and the catalyst supply hole is greater than a distance between the first gas supply hole and the second gas supply hole.

4. The substrate processing apparatus according to claim 1, wherein a distance between the first gas supply hole and the catalyst supply hole and a distance between the second gas supply hole and the catalyst supply hole are substantially same.

5. The substrate processing apparatus according to claim 1, wherein each of the first gas supply hole and the second gas supply hole is provided in a position substantially opposite to the catalyst supply hole with the substrate interposed therebetween.

6. The substrate processing apparatus according to claim 1, wherein the first process gas comprises a silicon-containing gas, and the second process gas comprises one of an oxygen-containing gas and a nitrogen-containing gas.

7. The substrate processing apparatus according to claim 1, wherein the catalyst is a combination of a heterocycle and nitrogen, and comprises one of pyridine, amino pyridine, picoline, piperazine and lutidine.

8. The substrate processing apparatus according to claim 1, wherein the process chamber further accommodates a plurality of substrates, and
   the first gas supply system, the second gas supply system and the catalyst supply system includes a first nozzle, a second nozzle and a third nozzle, respectively, each of the first nozzle, the second nozzle and the third nozzle extending in a stacked direction of the plurality of substrates in the process chamber, and including a plurality of supply holes provided along the stacked direction of the plurality of substrates.

9. The substrate processing apparatus according to claim 1, wherein a surface of the substrate includes a pattern.

* * * * *